US012213359B2

(12) United States Patent
Cho et al.

(10) Patent No.: US 12,213,359 B2
(45) Date of Patent: *Jan. 28, 2025

(54) DISPLAY DEVICE WITH VOLTAGE LINE CONTACT

(71) Applicant: SAMSUNG DISPLAY CO., LTD., Yongin-si (KR)

(72) Inventors: Seung-Hwan Cho, Yongin-si (KR); Wonsuk Choi, Seoul (KR); Tetsuhiro Tanaka, Hwaseong-si (KR); Jiryun Park, Cheonan-si (KR); Seokje Seong, Seongnam-si (KR); Seungwoo Sung, Cheonan-si (KR); Jiseon Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/226,229

(22) Filed: Jul. 25, 2023

(65) Prior Publication Data

US 2023/0371326 A1    Nov. 16, 2023

Related U.S. Application Data

(63) Continuation of application No. 17/209,222, filed on Mar. 23, 2021, now Pat. No. 11,737,326.

(30) Foreign Application Priority Data

Jul. 20, 2020    (KR) .................. 10-2020-0089451

(51) Int. Cl.
*H10K 59/131*    (2023.01)
*H10K 59/121*    (2023.01)

(52) U.S. Cl.
CPC ......... *H10K 59/131* (2023.02); *H10K 59/121* (2023.02)

(58) Field of Classification Search
CPC . H01L 27/3276; H10K 59/131; H10K 59/121
See application file for complete search history.

(56) References Cited

U.S. PATENT DOCUMENTS 9,660,012 B2    5/2017    Kim et al.
11,737,326 B2 *    8/2023    Cho ..................... H01L 27/124
                                                        257/40

(Continued)

FOREIGN PATENT DOCUMENTS

KR            101486038    1/2015
KR    10-2020-0029103    3/2020

OTHER PUBLICATIONS

Non-Final Office Action mailed Dec. 21, 2022, in U.S. Appl. No. 17/209,222.

(Continued)

*Primary Examiner* — Lex H Malsawma
(74) *Attorney, Agent, or Firm* — KILE PARK REED & HOUTTEMAN PLLC

(57) ABSTRACT

A display device includes a first active pattern disposed on a substrate, a first gate electrode disposed on the first active pattern, a second active pattern disposed on the first gate electrode, being electrically connected to the first gate electrode, and including an extension part extending in a first direction and a protrusion part protruding from the extension part in a second direction crossing the first direction, and a voltage line disposed on the second active pattern, extending in the first direction, and overlapping the protrusion part in an overlapping region. The voltage line contacts the protrusion part through a first contact, and the first contact entirely overlaps the overlapping region on a plane.

20 Claims, 22 Drawing Sheets

(56) References Cited

U.S. PATENT DOCUMENTS

| | | |
|---|---|---|
| 2003/0222589 A1 | 12/2003 | Osame et al. |
| 2012/0007080 A1 | 1/2012 | Liu |
| 2012/0313100 A1 | 12/2012 | Liu et al. |
| 2014/0034923 A1* | 2/2014 | Kim .................... H10K 59/123 |
| | | 257/40 |
| 2014/0077176 A1 | 3/2014 | Lee et al. |
| 2014/0098078 A1 | 4/2014 | Jeon et al. |
| 2015/0130691 A1 | 5/2015 | Jeon |
| 2017/0317156 A1* | 11/2017 | Kim ..................... G09G 3/3233 |
| 2018/0040640 A1* | 2/2018 | Takahashi ........... H01L 27/1225 |
| 2018/0061914 A1* | 3/2018 | Jeong .................. H10K 59/122 |
| 2018/0061922 A1* | 3/2018 | Kim .................. H10K 59/1216 |
| 2019/0341431 A1 | 11/2019 | Lee et al. |
| 2020/0083309 A1 | 3/2020 | Wang et al. |

OTHER PUBLICATIONS

Notice of Allowance issued Apr. 3, 2023, in U.S. Appl. No. 17/209,222.

* cited by examiner

DISPLAY DEVICE WITH VOLTAGE LINE CONTACT

CROSS-REFERENCE TO RELATED APPLICATION

This application is a Continuation of U.S. patent application Ser. No. 17/209,222, filed Mar. 23, 2021 (now U.S. Pat. No. 11,737,326), which claims priority from and the benefit of Korean Patent Application No. 10-2020-0089451, filed on Jul. 20, 2020, each of which is hereby incorporated by reference for all purposes as if fully set forth herein.

BACKGROUND

Field

Exemplary embodiments/implementations of the invention relate generally to a display device.

Discussion of the Background

A display device includes a display panel and a panel driver (e.g., a data driver, a gate driver, etc.) driving the display panel. A plurality of conductive patterns are sequentially formed on the display panel, and the conductive patterns may contact through contacts. The panel driver provides signals and/or voltages to the conductive patterns of the display panel. The conductive patterns are patterned to have repetitive unit structures on a plane, and the conductive patterns having one unit structure among the unit structures may be defined as a pixel structure. Meanwhile, contact resistance may occur between the conductive patterns contacting through the contact. As the distribution of the contact resistance increases, the distribution of electrical characteristics of the pixel structures may increase. This causes the display quality of the display device to deteriorate.

The above information disclosed in this Background section is only for understanding of the background of the inventive concepts, and, therefore, it may contain information that does not constitute prior art.

SUMMARY

Some example embodiments provide a display device with improved the display quality.

Additional features of the inventive concepts will be set forth in the description which follows, and in part will be apparent from the description, or may be learned by practice of the inventive concepts.

A display device according to an example embodiment may include a first active pattern disposed on a substrate, a first gate electrode disposed on the first active pattern, a second active pattern disposed on the first gate electrode, being electrically connected to the first gate electrode, and including an extension part extending in a first direction and a protrusion part protruding from the extension part in a second direction crossing the first direction, and a voltage line disposed on the second active pattern, extending in the first direction, and overlapping the protrusion part in an overlapping region. The voltage line may contact the protrusion part through a first contact, and the first contact may entirely overlap the overlapping region on a plane.

According to an example embodiment, a planar area of the first contact may be smaller than a planar area of the overlapping region.

According to an example embodiment, the voltage line may provide an initialization voltage for initializing the first gate electrode to the protrusion part.

According to an example embodiment, the overlapping region may have a rectangular shape including a first side adjacent to the extension part and extending in the first direction, a second side opposite to the first side and extending the first direction, a third side connecting one side of the first side and one side of the second side, and fourth side connecting the other side of the first side and the other side of the second side, and the first side may be spaced apart from the first contact by a first distance on a plane.

According to an example embodiment, the first distance may be about 1 um to about 10 um.

According to an example embodiment, the second side may be spaced apart from the first contact by a second distance on a plane.

According to an example embodiment, the third side may be spaced apart from the first contact by a third distance on a plane, and the fourth side may be spaced apart from the first contact by a fourth distance on a plane.

According to an example embodiment, the third distance and the fourth distance may be same to each other.

According to an example embodiment, each of the third distance and the fourth distance may be about 1 um to about 3 um.

According to an example embodiment, a width of the first contact in the first direction may be about 1 um to about 3 um.

According to an example embodiment, the voltage line may be spaced apart from the extension part on a plane.

According to an example embodiment, the voltage line may contact the protrusion part through the second contact spaced apart from the first contact, and the second contact may entirely overlap the overlapping region on a plane.

According to an example embodiment, a planar area of the second contact may be smaller than a planar area of the overlapping region.

According to an example embodiment, the display device may further include a first interlayer insulating layer disposed on the first gate electrode and a second interlayer insulating layer disposed on the voltage line. The voltage line may contact the protrusion part through a second contact spaced apart from the first contact, and the second interlayer insulating layer may contact the first interlayer insulating layer through the third contact connected to the second contact.

According to an example embodiment, the third contact may penetrate the extension part.

According to an example embodiment, the display device may further include a first gate line disposed on the first gate electrode and extending in the first direction and a second gate electrode disposed on the second active pattern and overlapping the first gate line.

According to an example embodiment, the second gate electrode may be electrically connected to the first gate line.

According to an example embodiment, the protrusion part may include a first part adjacent to one side of the extension part and not contacting the voltage line, the second active pattern may include a second part adjacent to the other side of the extension part and overlapping the second gate electrode, and a sheet resistance of the first part, a sheet resistance of the extension part, and a sheet resistance of the second part may be different from each other.

According to an example embodiment, the sheet resistance of the second part may be greater than the sheet resistance of the first part.

According to an example embodiment, the display device may further include a second gate line disposed on the first gate electrode and extending in the first direction and a third gate line disposed on the active pattern, extending in the first direction, and overlapping the second gate line.

According to an example embodiment, the third gate line may be electrically connected to the second gate line.

According to an example embodiment, the first active pattern may include a silicon semiconductor, and the second active pattern may include an oxide semiconductor.

According to an example embodiment, the display device may further include a data transmission horizontal line disposed on the voltage line, extending in the first direction, overlapping the voltage line, and transmitting a first data voltage, a data line disposed on the data transmission horizontal line, extending in the second direction, and providing the first data voltage to the first active pattern, and a data transmission vertical line disposed in a same layer as the data line, extending in the second direction, and transmitting a second data voltage different from the first data voltage.

A display device according to another example embodiment may include a first active pattern disposed on a substrate, a first gate electrode disposed on the first active pattern, a first interlayer insulating layer disposed on the first gate electrode, a second active pattern disposed on the first interlayer insulating layer, being electrically connected to the first gate electrode, and including an extension part extending in a first direction and a protrusion part protruding from the extension part in a second direction crossing the first direction, a voltage line disposed on the second active pattern, extending in the first direction, and overlapping the protrusion part in an overlapping region, and a second interlayer insulating layer disposed on the voltage line. The second interlayer insulating layer may contact the first interlayer insulating layer through a second contact connected to the first contact.

According to an example embodiment, the second contact may penetrate the extension part.

According to an example embodiment, the voltage line may provide an initialization voltage for initializing the first gate electrode to the protrusion part.

According to an example embodiment, the voltage line may contact the protrusion part through a third contact, the third contact spaced apart from the first contact and overlapping the overlapping region, and the second interlayer insulating layer may contact the first interlayer insulating layer through a fourth contact connected to the third contact.

According to an example embodiment, the display device may further include a data transmission horizontal line disposed on the second interlayer insulating layer, extending in the first direction, overlapping the voltage line, and transmitting a first data voltage, a data line disposed on the data transmission horizontal line, extending in the second direction, and providing the first data voltage to the first active pattern, and a data transmission vertical line disposed in a same layer as the data line, extending in the second direction, and transmitting a second data voltage different from the first data voltage.

Therefore, a display device according to example embodiments may include a plurality of pixel structures, and each of the pixel structures may include a first active pattern, a second active pattern, and a voltage line extending in a first direction. The second active pattern may include a protrusion part extending in a second direction and overlapping the voltage line in an overlapping region. The voltage line may contact the protrusion part through a first contact entirely overlapping the overlapping region. Accordingly, distribution of the contact resistance between the voltage line and the protrusion part generated in the pixel structures may be reduced. In addition, the voltage line may contact the protrusion part through a second contact spaced apart from the first contact. Accordingly, the contact resistance may be reduced. Therefore, distribution of the contact resistance may be reduced.

It is to be understood that both the foregoing general description and the following detailed description provide examples, are explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

FIGS. 3, 4, 5, 6, 7, 8, 9, 10, and 11 are layout diagrams illustrating pixel structures included in the display device of FIG. 1a.

DETAILED DESCRIPTION

Figure 1A:
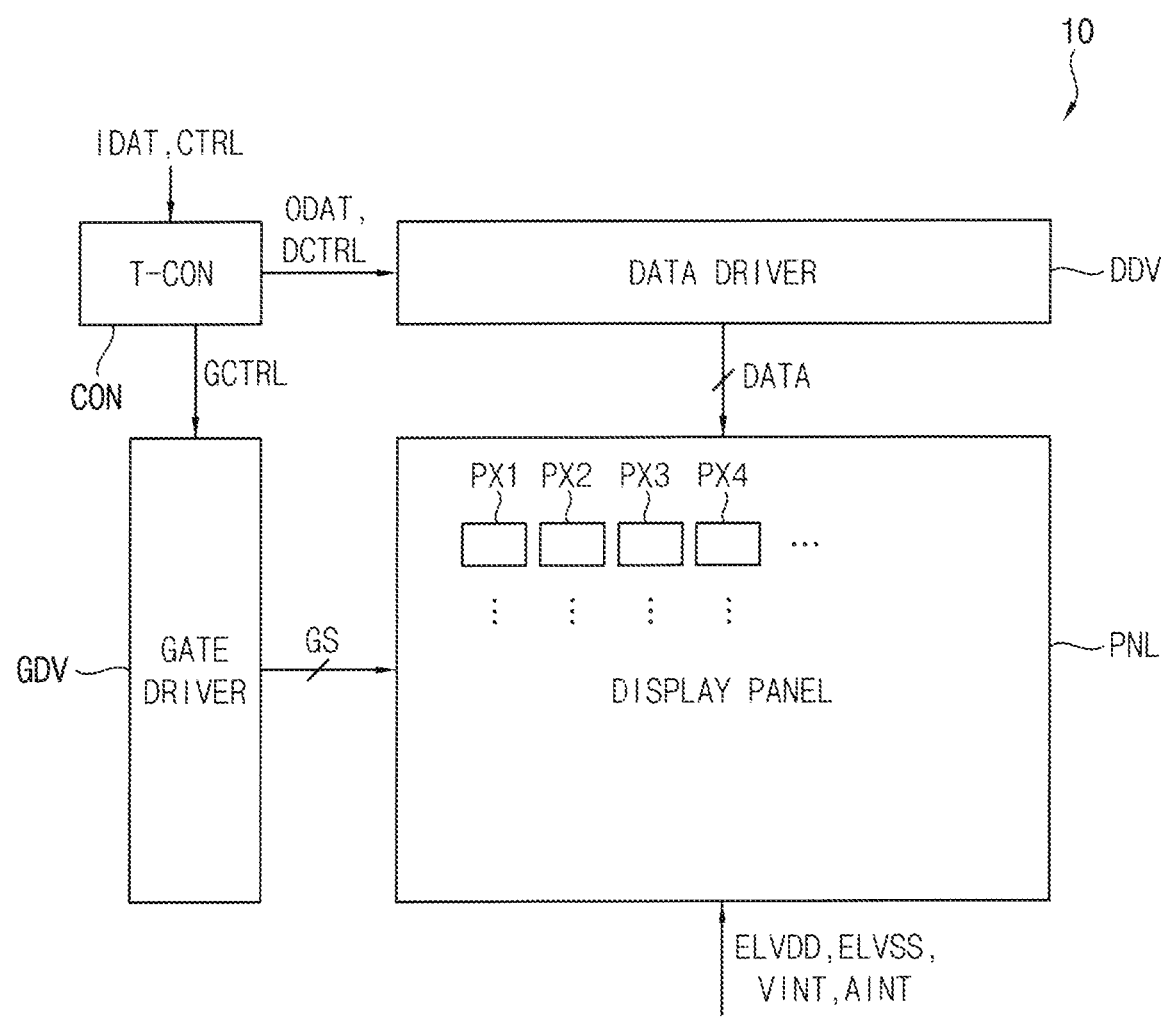
FIG. 1A is a block diagram illustrating a display device according to example embodiments.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are illustrated in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Illustrative, non-limiting example embodiments will be more clearly understood from the following detailed description in conjunction with the accompanying drawings.

Figure 1B:
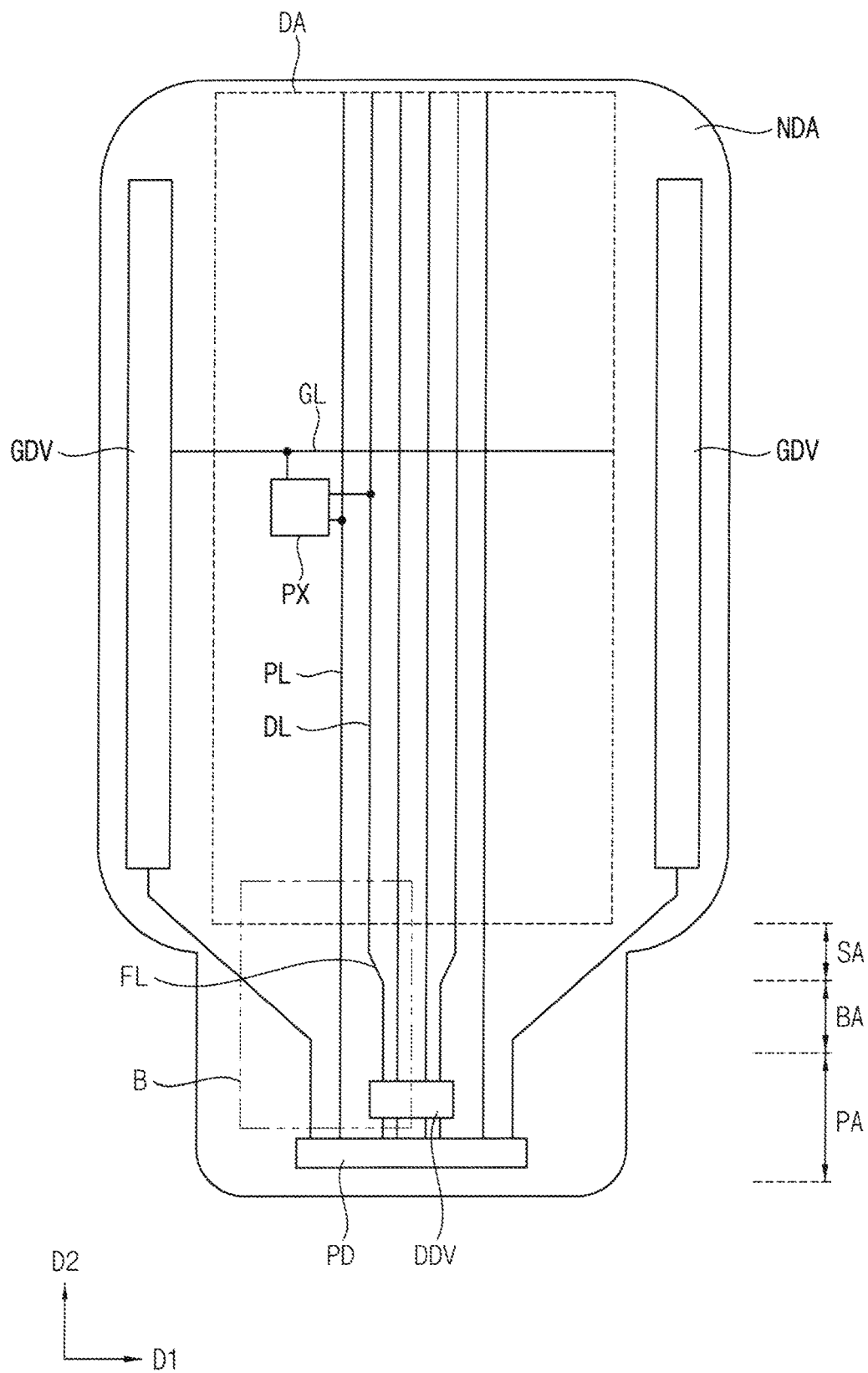
FIG. 1B is a plan view illustrating the display device of FIG. 1A.
Figure 1C:
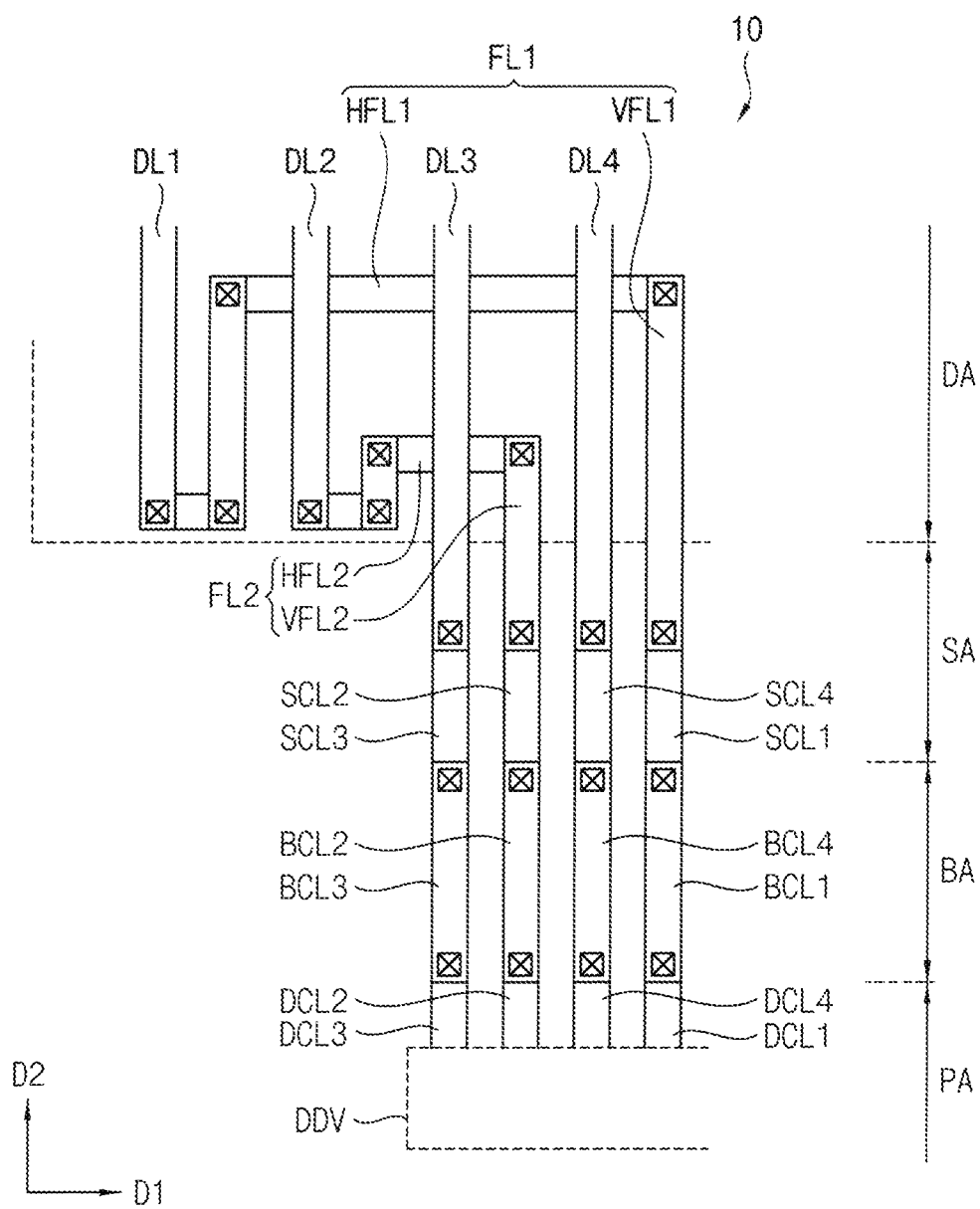
FIG. 1C is an enlarged view illustrating data transmission lines included in the display device of FIG. 1B.

FIG. 1a is a block diagram illustrating a display device according to example embodiments. FIG. 1b is a plan view illustrating the display device of FIG. 1a. FIG. 1c is an enlarged view illustrating data transmission lines included in the display device of FIG. 1b.

Referring to FIG. 1a, a display device 10 according to an example embodiment may include a display panel PNL, a data driver DDV, a gate driver GDV, and a controller CON.

Figure 2:
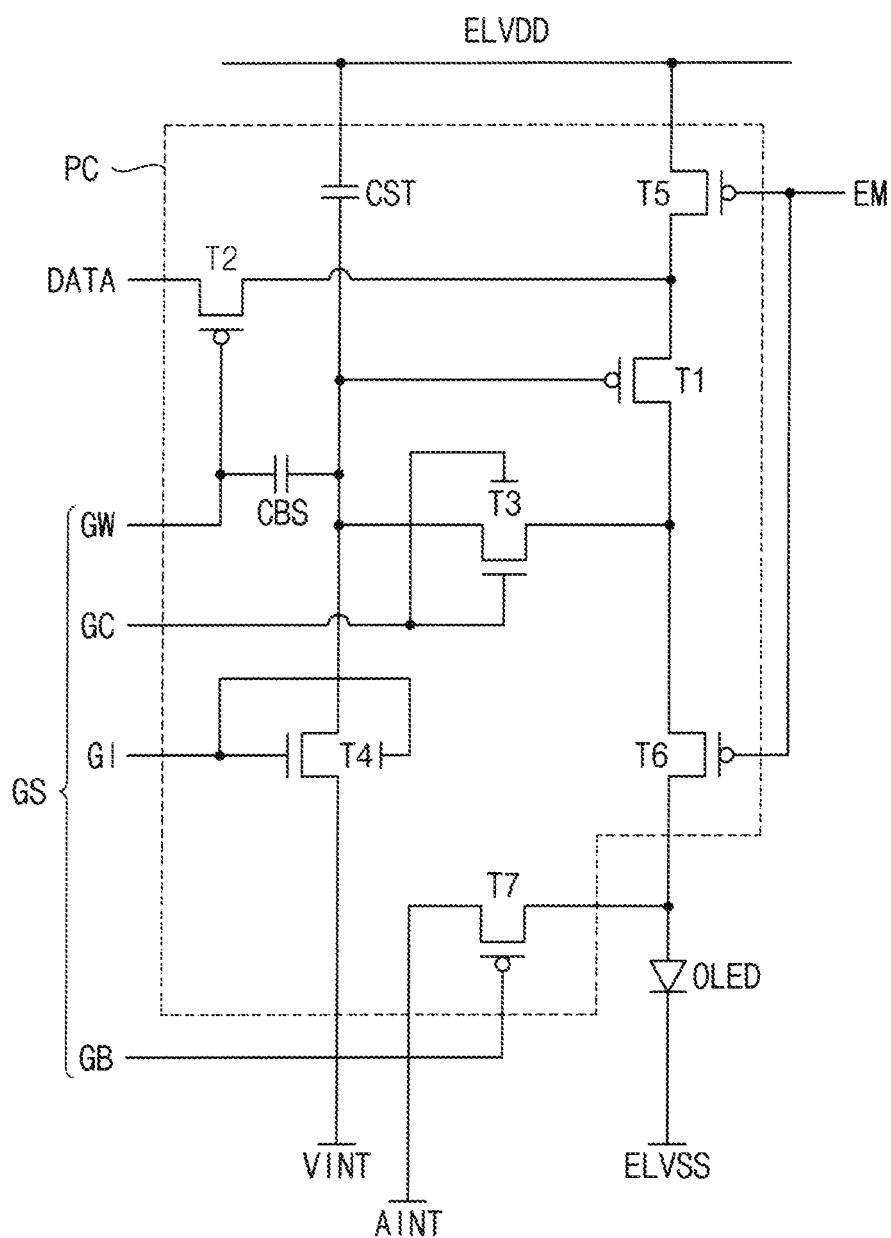
FIG. 2 is a circuit diagram illustrating a pixel circuit and an organic light emitting diode included in the display device of FIG. 1A.

The display panel PNL may include a plurality of pixel structures (e.g., the pixel structures PX of FIG. 2). For example, the display panel PNL may include a first pixel structure PX1, a second pixel structure PX2, a third pixel structure PX3, and a fourth pixel structure PX4. Each of the first to fourth pixel structures PX1, PX2, PX3, and PX4 may be provided with a data voltage DATA, a gate signal GS, a high power voltage ELVDD, a low power voltage ELVSS, an initialization voltage VINT, and anode initialization voltage AINT.

The data driver DDV may generate the data voltage DATA based on an output image data ODAT and a data control signal DCTRL. For example, the data driver DDV may generate the data voltage DATA corresponding to the output image data ODAT, and may output the data voltage DATA in response to the data control signal DCTRL. The data control signal DCTRL may include an output data enable signal, a horizontal start signal, and a load signal. In an example embodiment, the data driver DDV may be electrically connected to the display panel PNL through one or more integrated circuits (ICs). In another example embodiment, the data driver DDV may be mounted on the display panel PNL or may be integrated into a peripheral region of the display panel PNL.

The gate driver GDV may generate the gate signal GS based on a gate control signal GCTRL. For example, the gate signal GS may include a gate-on voltage to turn on a transistor and a gate-off voltage to turn off the transistor. The gate control signal GCTRL may include a vertical start signal, a clock signal, and the like. In an example embodiment, the gate driver GDV may be mounted on the display panel PNL. In another example embodiment, the gate driver GDV may be electrically connected to the display panel PNL in a form of a chip-on-film ("COF").

The controller CON (e.g., timing controller ("T-CON")) may receive an input image data IDAT and a control signal CTRL from an external host processor (e.g., GPU). For example, the input image data IDAT may be RGB data including red image data, green image data, and blue image data. The control signal CTRL may include a vertical synchronization signal, a horizontal synchronization signal, an input data enable signal, a master clock signal, and the like. The controller CON may generate the gate control signal GCTRL, the data control signal DCTRL, and the output image data ODAT based on the input image data IDAT and the control signal CTRL.

Referring to FIGS. 1b and 1c, the display device 10 may include a display region DA, a non-display region NDA surrounding the display region DA, a bending region BA to be bent, a peripheral region SA between the display region DA and the bending region BA, and a pad region PA.

For example, the pixel structure PX may be disposed in the display region DA, and a driver GDV configured to drive the pixel structure PX may be disposed in the non-display region NDA. In addition, a pad part PD and a data driver DDV may be disposed in the pad region PA, and the bending region BA may be bent based on a virtual bending axis.

The pixel structure PX, a data line DL connected to the pixel structure PX, a gate line GL connected to the pixel structure PX, a high power voltage line PL connected to the pixel structure PX, and data transmission lines FL1 and FL2 may be disposed in the display region DA.

The data line DL may be electrically connected to the data driver DDV and may extend in the second direction D2. The gate line GL may be connected to the gate driver GDV and may extend in a first direction D1 crossing the second direction D2. The high power voltage line PL may be connected to the pad part PD and may extend in the second direction D2.

The data transmission lines FL1 and FL2 may be electrically connected to the data driver DDV and the data line DL. The data transmission lines FL1 and FL2 may connect the data driver DDV and the data line DL.

In an example embodiment, as illustrated in FIG. 1c, the display device 10 may include first to fourth data lines DL1, DL2, DL3 and DL4, a first data transmission line FL1, and a second data transmission line FL2. For example, the first and second data transmission lines FL1 and FL2 may be fan-out lines electrically connecting the data driver DDV and the data line DL.

In an example embodiment, the first data transmission line FL1 may include a first data transmission vertical line VFL1 and a first data transmission horizontal line HFL1, and the second data transmission line FL2 may include a second data transmission vertical line VFL2 and a second data transmission horizontal line HFL2. For example, the first and second data transmission vertical lines VFL1 and VFL2 may extend in the second direction D2, and the first and second data transmission horizontal lines HFL1 and HFL2 may extend in the first direction D1.

The first data transmission line FL1 may electrically connect the data driver DDV and the first data line DL1. For example, a first data voltage may be provided to the first pixel structure PX1 through the first data transmission line FL1 and the first data line DL1.

In detail, the first data transmission vertical line VFL1 may be connected to a first connection line SCL1, the first connection line SCL1 may be connected to a first bending connection line BCL1, and the first bending connection line BCL1 may be connected to a first data connection line DCL1.

Figure 11:
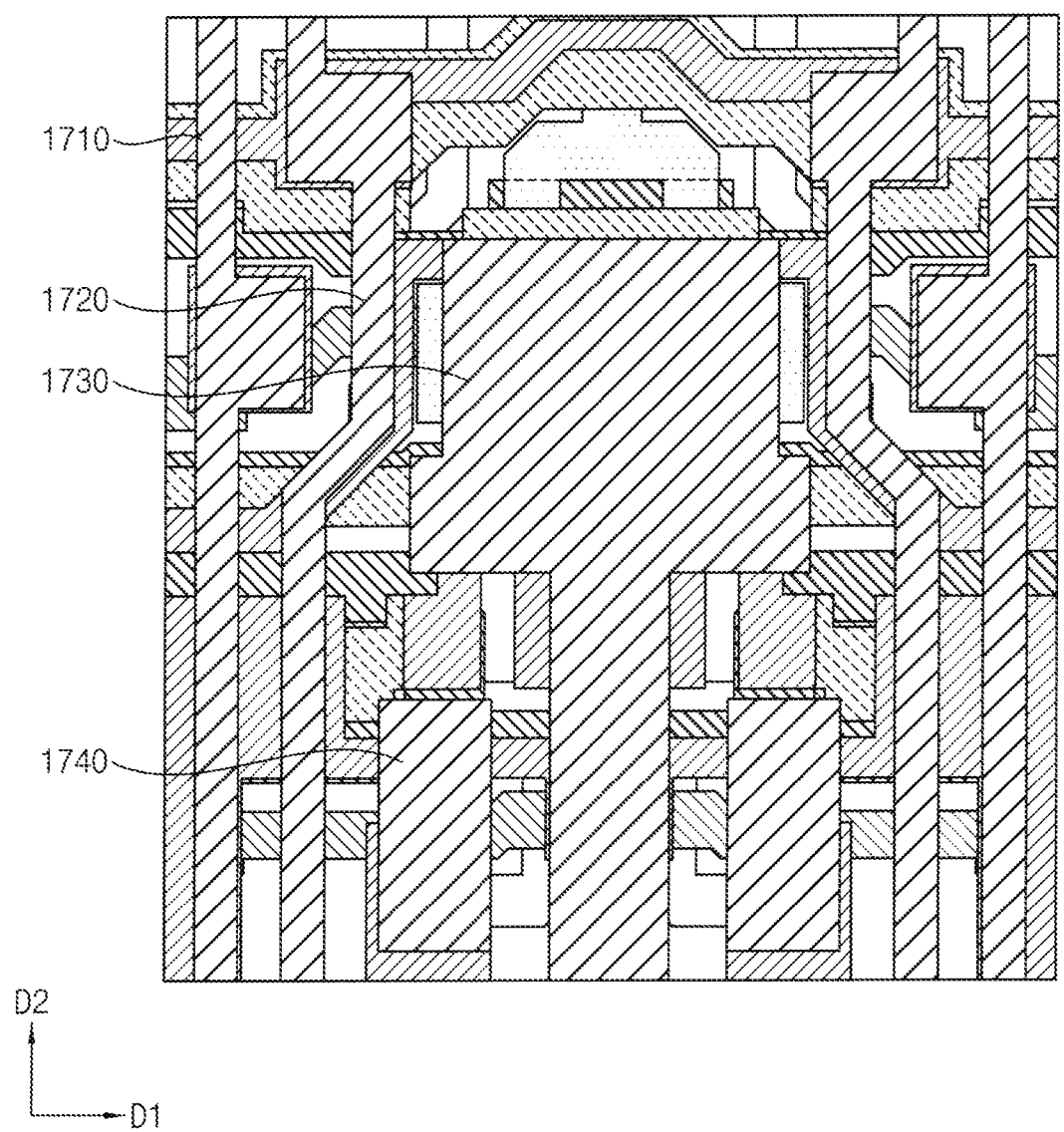

For example, the first data transmission vertical line VFL1 may extend from the peripheral region SA to the display region DA, and may be formed in a first layer (e.g. a first layer in which a data transmission vertical line 1720 of FIG. 11 is formed). The first connection line SCL1 may be disposed in the peripheral region SA, and may be formed in a second layer disposed under the first layer. The first bending connection line BCL1 may be disposed in the bending region BA, and may be formed in the first layer. The first data connection line DCL1 may be disposed in the pad region PA, and may be provided with the first data voltage from the data driver DDV.

The second data transmission line FL2 may electrically connect the data driver DDV and the second data line DL2. For example, the second data voltage may be provided to the second pixel structure PX2 through the second data transmission line FL2 and the second data line DL2.

In detail, the second data transmission vertical line VFL2 may be connected to a second connection line SCL2, the second connection line SCL2 may be connected to a second bending connection line BCL2, and the second bending connection line BCL2 may be connected to a second data connection line DCL2. However, because the structure of the second data transmission vertical line VFL2, the second connection line SCL2, the second bending connection line BCL2, and the second data connection line DCL2 are substantially same as the structure of the first data transmission vertical line VFL1, the first connection line SCL1, the first bending connection line BCL1, and the first data connection line DCL1, a detailed description will be omitted.

The third data line DL3 may be connected to the data driver DDV. For example, the third data voltage may be provided to the third pixel structure PX3 through the third data line DL3.

In detail, the third data line DL3 may be connected to a third connection line SCL3, the third connection line SCL3 may be connected to a third bending connection line BCL3, and the third bending connection line BCL3 may be connected to the third data connection line DCL3.

For example, the third data line DL3 may extend from the peripheral region SA to the display region DA, and may be formed in the first layer. The third connection line SCL3 may be disposed in the peripheral region SA, and may be formed in a third layer disposed under the first layer. The third bending connection line BCL3 may be disposed in the bending region BA, and may be formed in the first layer. The third data connection line DCL3 may be disposed in the pad region PA, and may be provided with the third data voltage from the data driver DDV.

The fourth data line DL4 may be connected to the data driver DDV. For example, the fourth data voltage may be provided to the fourth pixel structure PX4 through the fourth data line DL4.

In detail, the fourth data transmission vertical line VFL4 may be connected to a fourth connection line SCL4, the fourth connection line SCL4 may be connected to a fourth bending connection line BCL4, and the fourth bending connection line BCL4 may be connected to a fourth data connection line DCL4. However, because the structure of the fourth data transmission vertical line VFL4, the fourth connection line SCL4, the fourth bending connection line BCL4, and the fourth data connection line DCL4 are substantially same as the structure of the third data transmission vertical line VFL3, the third connection line SCL3, the third bending connection line BCL3, and the third data connection line DCL3, a detailed description will be omitted.

FIG. 2 is a circuit diagram illustrating a pixel circuit and an organic light emitting diode included in the display device of FIG. 1a.

Referring to FIGS. 1a and 2, the first pixel structure PX1 may emit light through a pixel circuit PC and an organic light emitting diode OLED. In addition, the second pixel structure PX2 may emit light through a pixel circuit having substantially the same circuit structure as the pixel circuit PC and an organic light emitting diode having substantially the same structure as the organic light emitting diode OLED. Hereinafter, a connection structure between the pixel circuit PC and the organic light emitting diode OLED of the first pixel structure PX1 will be described.

The pixel circuit PC may include a first transistor T1, a second transistor T2, a third transistor T3, a fourth transistor T4, a fifth transistor T5, a sixth transistor T6, and a seventh transistor T7, a storage capacitor CST, and a boosting capacitor CBS. The pixel circuit PC may be electrically connected to the organic light emitting diode OLED to provide a driving current to the organic light emitting diode OLED.

The organic light emitting diode OLED may include a first terminal (e.g., an anode terminal) and a second terminal (e.g., a cathode terminal). The first terminal may be connected to the first transistor T1 through the transistor T6 to receive the driving current, and the second terminal may receive the low power voltage ELVSS. The organic light emitting diode OLED may generate light having a luminance corresponding to the driving current.

The storage capacitor CST may include a first terminal and a second terminal. The first terminal of the storage capacitor CST may be connected to the first transistor T1, and the second terminal of the storage capacitor CST may receive the high power voltage ELVDD.

The boosting capacitor CBS may include a first terminal and a second terminal. The first terminal of the boosting capacitor CBS may be connected to the first terminal of the storage capacitor CST, and the second terminal of the boosting capacitor CBS may receive the first gate signal GW. The boosting capacitor CBS may compensate for the voltage drop of a gate terminal of the first transistor T1 by increasing the voltage of the gate terminal of the first transistor T1, when the provision of the first gate signal GW is stopped.

The first transistor T1 may include the gate terminal, a first terminal (e.g., a source terminal), and a second terminal (e.g., a drain terminal). The gate terminal of the first transistor T1 may be connected to the first terminal of the storage capacitor CST. The first terminal of the first transistor T1 may be connected to the second transistor T2 to receive the data voltage DATA. The second terminal of the first transistor T1 may provide the driving current to the organic light emitting diode OLED. The first transistor T1 may generate the driving current based on a voltage difference between the gate terminal and the first terminal. For example, the first transistor T1 may be referred to as a driving transistor. In an example embodiment, the first transistor T1 may further include a back-gate terminal. For example, the back-gate terminal may be synchronized with the gate terminal or the first terminal of the first transistor T1 or may be electrically floating. The back-gate terminal may include a metal, an alloy, a conductive metal oxide, a transparent conductive material, a doped silicon semiconductor, or the like. The back-gate terminal may overlap the gate terminal and may be implemented under the gate terminal.

The second transistor T2 may include a gate terminal, a first terminal (e.g., a source terminal), and a second terminal (e.g., a drain terminal). The gate terminal of the second transistor T2 may receive the first gate signal GW. The first terminal of the second transistor T2 may receive the data voltage DATA. The second terminal of the second transistor T2 may provide the data voltage DATA to the first terminal of the first transistor T1 while the second transistor T2 is turned on.

The second transistor T2 may be turned on or off in response to the first gate signal GW. For example, when the second transistor T2 is a PMOS transistor, the second transistor T2 may be turned off when the first gate signal GW has a positive voltage level, and may be turned on when the first gate signal GW has a negative voltage level. For example, the second transistor T2 may be referred to as a switching transistor.

The third transistor T3 may include a gate terminal, a back-gate terminal, a first terminal (e.g., a source terminal), and a second terminal (e.g., a drain terminal). The gate terminal and the back-gate terminal of the third transistor T3 may receive a second gate signal GC. As the third transistor T3 has a dual-gate structure, reliability of the third transistor T3 may be improved. The first terminal of the third transistor T3 may be connected to the second terminal of the first transistor T1. The second terminal of the third transistor T3 may be connected to the gate terminal of the first transistor T1.

The third transistor T3 may be turned on or off in response to the second gate signal GC. For example, when the third transistor T3 is an NMOS transistor, the third transistor T3 may be turned on when the second gate signal GC has a positive voltage level, and may be turned off when the second gate signal GC has a negative voltage level.

During a period in which the third transistor T3 is turned on in response to the second gate signal GC, the third transistor T3 may diode-connect the first transistor T1. Because the first transistor T1 is diode-connected, a voltage difference equal to a threshold voltage of the first transistor T1 may occur between the gate terminal of the first transistor T1 and the first terminal of the first transistor T1. Accordingly, the data voltage DATA compensated by the voltage difference may be provided to the gate terminal of the first transistor T1. Accordingly, the third transistor T3 may compensate for the threshold voltage of the first transistor T1. For example, the third transistor T3 may be referred to as a compensation transistor.

The fourth transistor T4 may include a gate terminal, a back-gate terminal, a first terminal (e.g., a source terminal), and a second terminal (e.g., a drain terminal). The gate terminal and the back-gate terminal of the fourth transistor T4 may receive a third gate signal GI. As the fourth transistor T4 has a dual-gate structure, reliability of the fourth transistor T4 may be improved. The first terminal of the fourth transistor T4 may be connected to the gate terminal of the first transistor T1. The second terminal of the fourth transistor T4 may receive the initialization voltage VINT.

The fourth transistor T4 may be turned on or off in response to the third gate signal GI. For example, when the fourth transistor T4 is an NMOS transistor, the fourth transistor T4 may be turned on when the third gate signal GI has a positive voltage level, and may be turned off when the third gate signal GI has a negative voltage level.

While the fourth transistor T4 is turned on to the third gate signal GI, the initialization voltage VINT may be provided to the gate terminal of the first transistor T1. Accordingly, the fourth transistor T4 may initialize the gate terminal of the first transistor T1 to the initialization voltage VINT. For example, the fourth transistor T4 may be referred to as an initialization transistor.

The fifth transistor T5 may include a gate terminal, a first terminal (e.g., a source terminal), and a second terminal (e.g., a drain terminal). The gate terminal of the fifth transistor T5 may receive an emission control signal EM. The first terminal of the fifth transistor T5 may receive the high power voltage ELVDD. The second terminal of the fifth transistor T5 may be connected to the first terminal of the first transistor T1. When the fifth transistor T5 is turned on in response to the emission control signal EM, the fifth transistor T5 may provide the high power voltage ELVDD to the first transistor T1.

The sixth transistor T6 may include a gate terminal, a first terminal (e.g., a source terminal), and a second terminal (e.g., a drain terminal). The gate terminal of the sixth transistor T6 may receive the emission control signal EM. The first terminal of the sixth transistor T6 may be connected to the second terminal of the first transistor T1. The second terminal of the sixth transistor T6 may be connected to the first terminal of the organic light emitting diode OLED. When the sixth transistor T6 is turned on in response to the emission control signal EM, the sixth transistor T6 may provide the driving current generated by the first transistor T1 to the organic light emitting diode OLED.

The seventh transistor T7 may include a gate terminal, a first terminal (e.g., a source terminal), and a second terminal (e.g., a drain terminal). The gate terminal of the seventh transistor T7 may receive a fourth gate signal GB. The first terminal of the seventh transistor T7 may receive the anode initialization voltage AINT. The second terminal of the seventh transistor T7 may be connected to the first terminal of the organic light emitting diode OLED. When the seventh transistor T7 is turned on in response to the fourth gate signal GB, the seventh transistor T7 may provide the anode initialization voltage AINT to the organic light emitting diode OLED. Accordingly, the seventh transistor T7 may initialize the first terminal of the organic light emitting diode OLED to the anode initialization voltage AINT. For example, the seventh transistor T7 may be referred to as an anode initialization transistor.

Meanwhile, the connection structure of the pixel circuit PC and the organic light emitting diode OLED illustrated in FIG. 2 is and may be variously changed.

FIG. 3 to FIG. 11 are layout diagrams illustrating pixel structures included in the display device of FIG. 1a.

Figure 3:
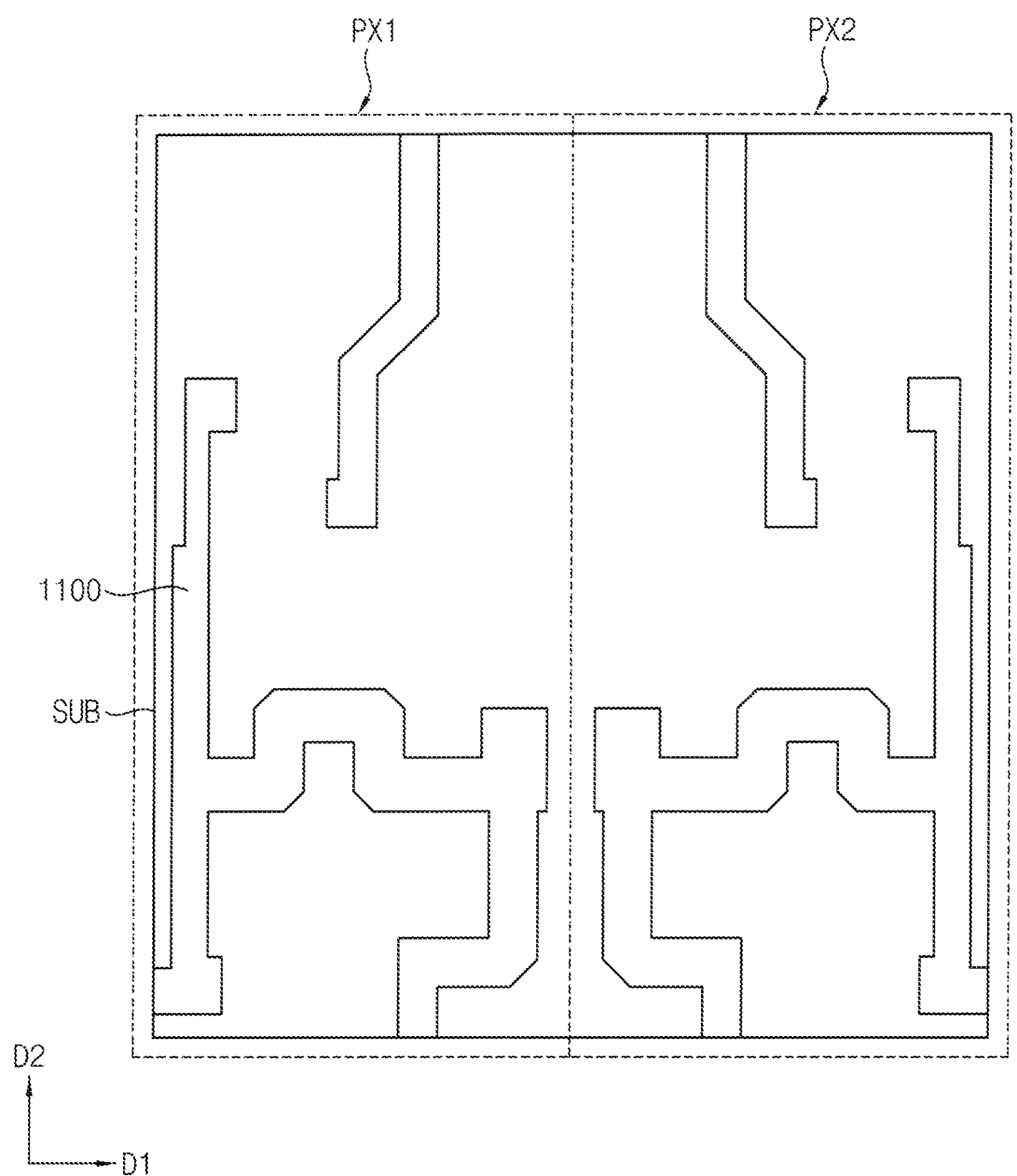

Referring to FIGS. 1a, 2, and 3, the display device 10 may include the first pixel structure PX1 and the second pixel structure PX2 adjacent to each other. For example, the second pixel structure PX2 may have a structure in which the structure of the first pixel structure PX1 is symmetrical with respect to a virtual symmetric line 310.

The substrate SUB may include glass, quartz, plastic, or the like. In an example embodiment, the substrate SUB may include plastic, and thus the display device 10 may have a flexible characteristic. In this case, the substrate SUB may have a structure in which at least one organic film layer and at least one barrier layer are alternately stacked. For example, the organic film layer may be formed using an organic material such as polyimide, and the barrier layer may be formed using an inorganic material.

A barrier layer (e.g., a barrier layer BRR of FIG. 13) may be disposed on the substrate SUB. The barrier layer may prevent diffusion of metal atoms or impurities from the substrate SUB into a first active pattern 1100.

A buffer layer (e.g., a buffer layer BFR of FIG. 13) may be disposed on the substrate SUB. The buffer layer may prevent diffusion of metal atoms or impurities from the substrate SUB into the first active pattern 1100. In addition, the buffer layer may control a heat supply rate during a crystallization process of forming the first active pattern 1100, and the first active pattern 1100 may be uniformly formed.

The first active pattern 1100 may be disposed on the buffer layer. In an example embodiment, the first active pattern 1100 may include a silicon semiconductor. For example, the silicon semiconductor may include amorphous silicon, polycrystalline silicon, or the like. For example, the first active pattern 1100 may include the polycrystalline silicon formed by crystallizing the amorphous silicon.

In an example embodiment, ions may be implanted into the first active pattern 1100. For example, when the first, second, fifth, sixth, and seventh transistors T1, T2, T5, T6, and T7 are the PMOS transistors, ions such as boron may be implanted in the first active pattern 1100.

A first gate insulating layer may cover the first active pattern 1100 and may be disposed on the substrate SUB. The first gate insulating layer may include an insulating material. For example, the first gate insulating layer may include silicon oxide, silicon nitride, silicon oxynitride, aluminum oxide, or the like.

Figure 4:
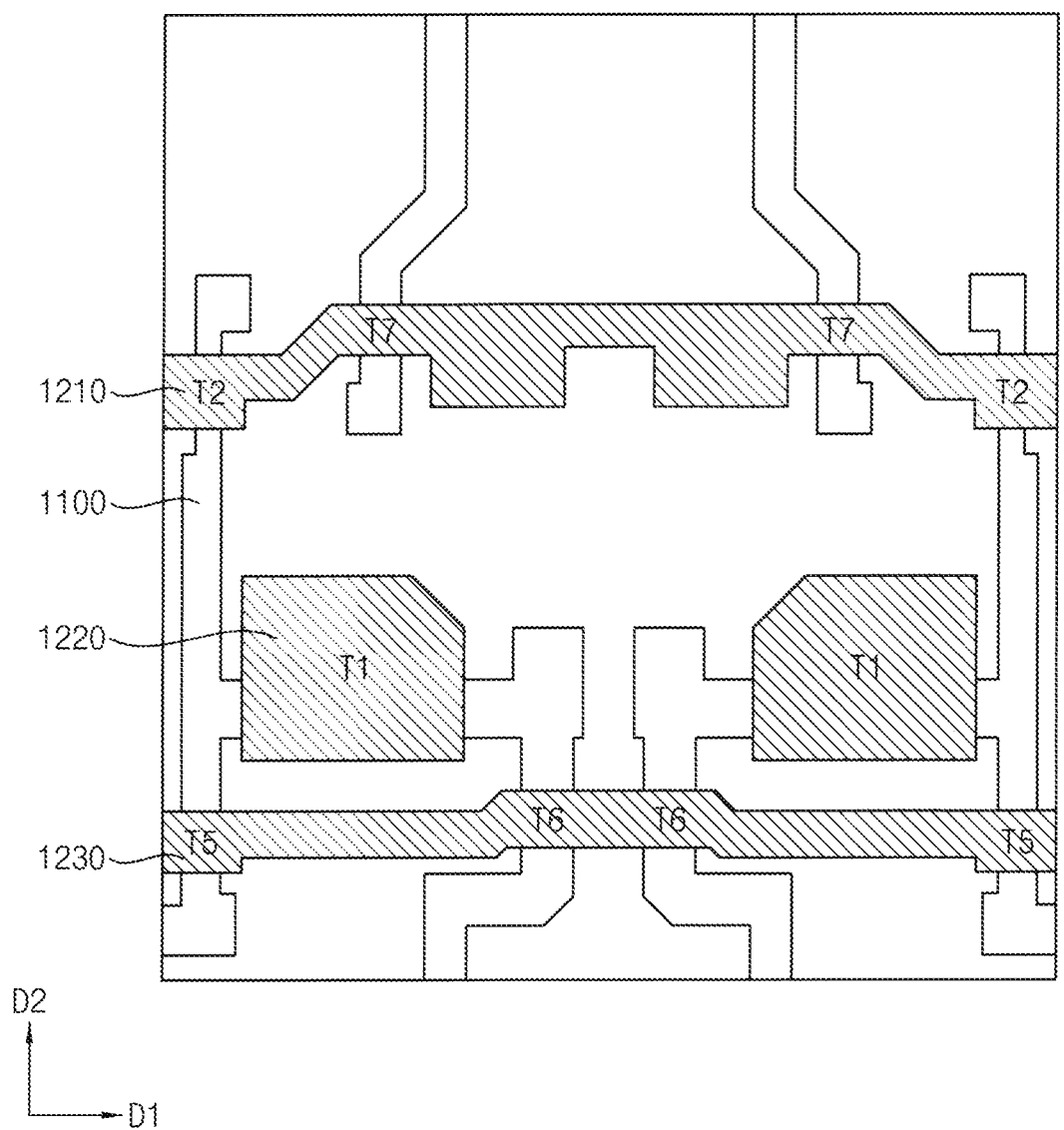

Referring to FIGS. 1a, 2, and 4, the first conductive pattern may be disposed on the first gate insulating layer. The first conductive pattern may include a first gate line 1210, a gate electrode 1220, and a second gate line 1230.

The first gate line 1210 may extend in a first direction D1. The first gate line 1210 may constitute the second transistor T2 together with the first active pattern 1100. For example, the first gate signal GW may be provided to the first gate line 1210. In addition, the first gate line 1210 may constitute the seventh transistor T7 together with the first active pattern 1100. For example, the fourth gate signal GB may be provided to the first gate line 1210. The first gate signal GW and the fourth gate signal GB may have substantially the same waveform with a time difference.

The first gate electrode 1220 may be disposed in an island shape. The first gate electrode 1220 may constitute the first transistor T1 together with the first active pattern 1100.

The second gate line 1230 may extend in the first direction D1. The second gate line 1230 may constitute the fifth and sixth transistors T5 and T6 together with the first active pattern 1100. For example, the emission control signal EM may be provided to the second gate line 1230. The second gate line 1230 may be referred to as an emission control line.

For example, the first conductive pattern may include a metal, an alloy, a conductive metal oxide, a transparent conductive material, and the like. For example, the first conductive pattern may include silver ("Ag"), an alloy containing silver, molybdenum ("Mo"), an alloy containing molybdenum, aluminum ("Al"), an alloy containing aluminum, and aluminum nitride ("AN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like.

The second gate insulating layer may cover the first conductive pattern and may be disposed on the first gate insulating layer. The second gate insulating layer may include an insulating material.

Figure 5:
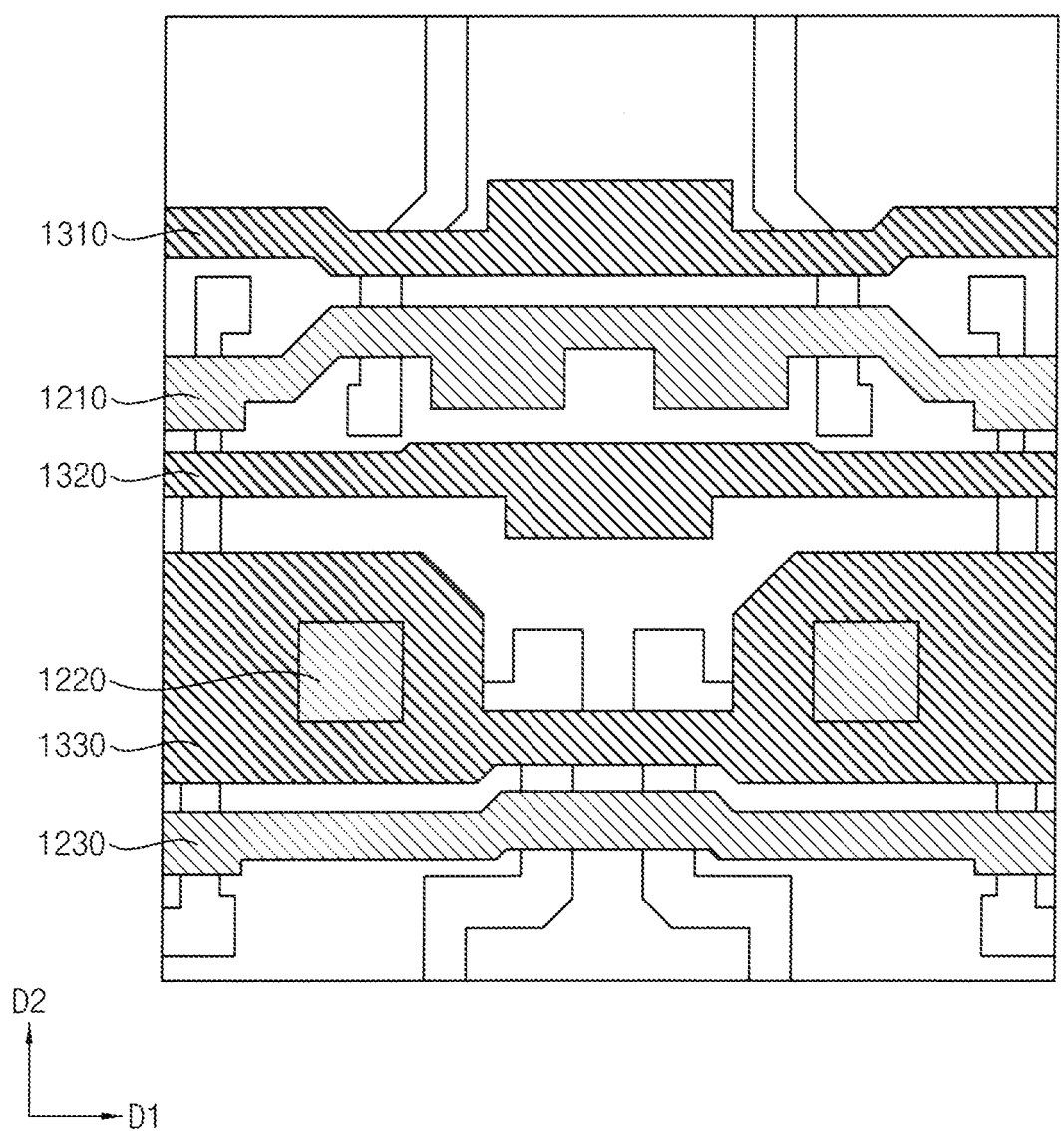
Figure 6:
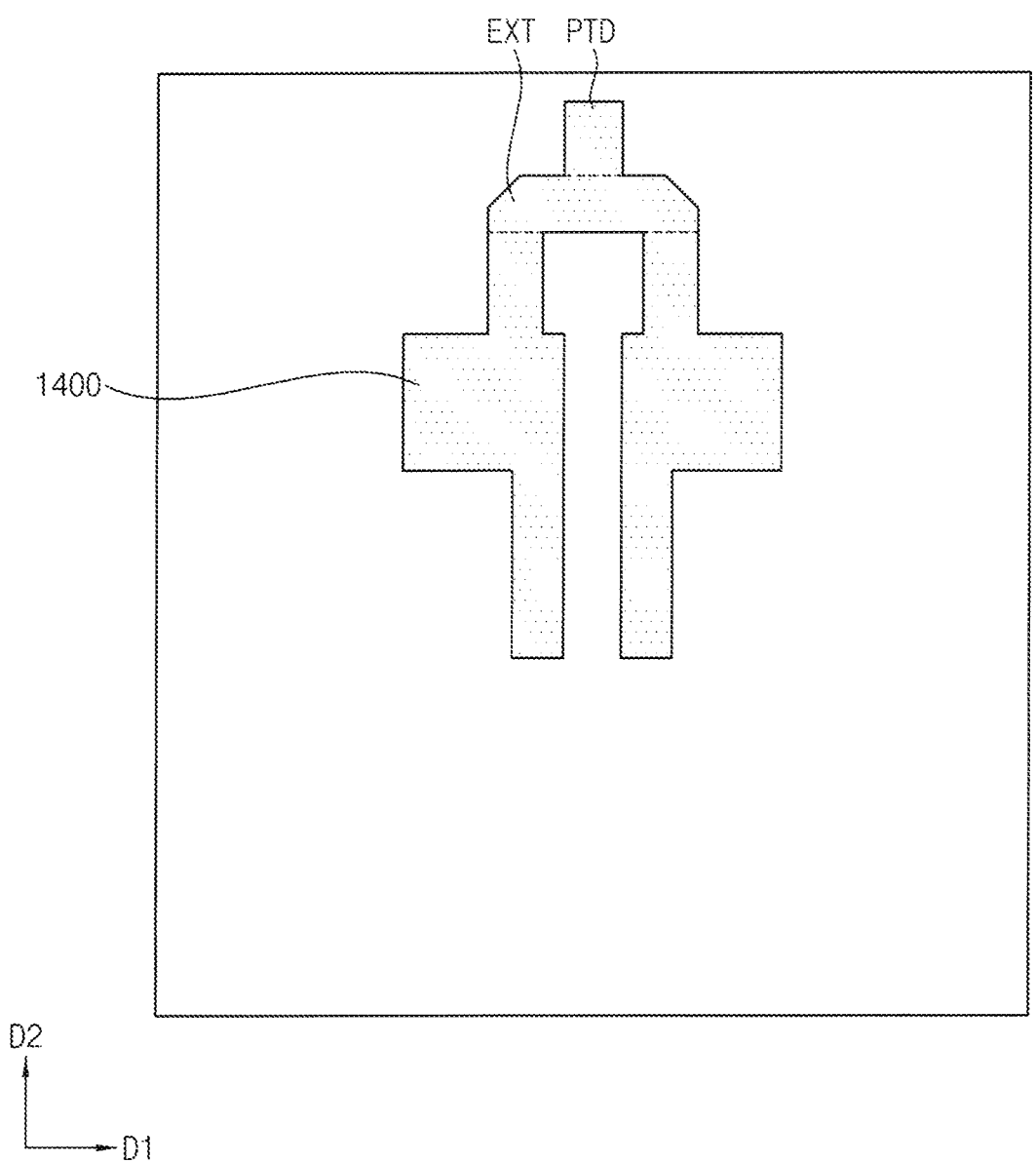
Figure 7:
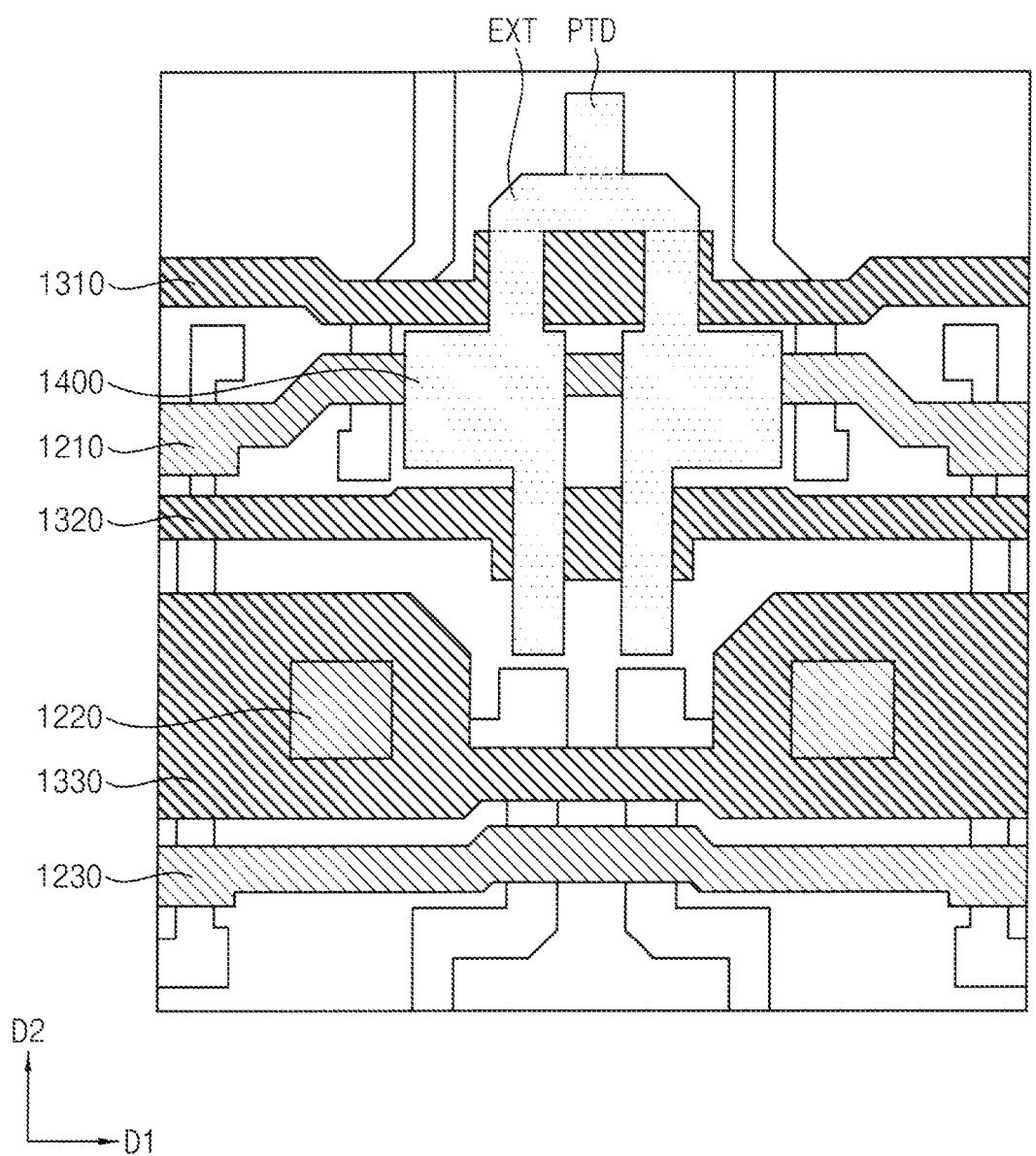
Figure 8:
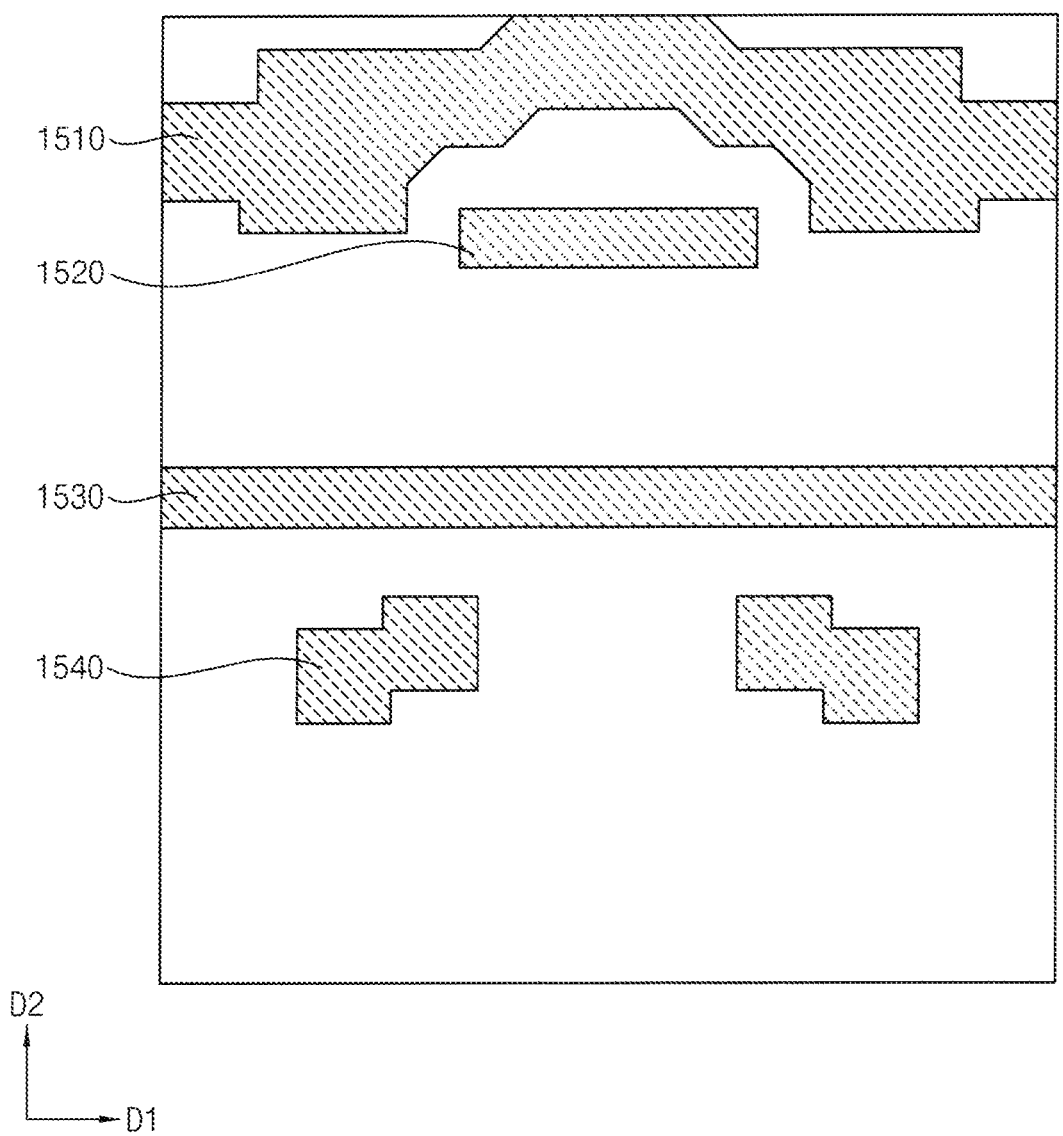

Referring to FIGS. 1a, 2, and 5, the second conductive pattern may be disposed on the second gate insulating layer. The second conductive pattern may include a third gate line 1310, a fourth gate line 1320, and a storage capacitor electrode 1330.

The third gate line 1310 may extend in the first direction D1. For example, the third gate line 1310 may be spaced apart from the first gate line 1210 on a plane. The third gate signal GI may be provided to the third gate line 1310.

The fourth gate line 1320 may extend in the first direction D1. For example, the fourth gate line 1320 may be spaced apart from the first gate line 1210 and the third gate wiring 1310 on a plane. The second gate signal GC may be provided to the fourth gate line 1320.

The storage capacitor electrode 1330 may overlap the first gate electrode 1220 and may extend in the first direction D1. For example, the storage capacitor electrode 1330 may constitute the storage capacitor CST together with the first gate electrode 1220. The high power voltage ELVDD may be provided to the storage capacitor electrode 1330. In addition, a hole penetrating the storage capacitor electrode 1330 may be formed in the storage capacitor electrode 1330, and the first gate electrode 1220 may be exposed through the hole.

For example, the second conductive pattern may include a metal, an alloy, a conductive metal oxide, a transparent conductive material, and the like.

The first interlayer insulating layer may cover the second conductive pattern and may be disposed on the second gate insulating layer. The first interlayer insulating layer may include an insulating material. For example, the first interlayer insulating layer may include silicon oxide, silicon nitride, silicon oxynitride, aluminum oxide, or the like.

Referring to FIGS. 1a, 2, 6, and 7, a second active pattern 1400 may be disposed on the first interlayer insulating layer. The second active pattern 1400 may include an oxide semiconductor. In an example embodiment, the second active pattern 1400 may be disposed on a different layer from the first active pattern 1100 and may not overlap the first active pattern 1100. In other words, the second active pattern 1400 may be formed separately from the first active pattern 1100.

The second active pattern 1400 may include an extension part EXT and a protrusion part PTD. The extension part EXT may extend in the first direction D1. The protrusion part PTD may protrude from the extension part EXT in the second direction D2.

The third gate insulating layer may cover the second active pattern 1400 and may be disposed on the first interlayer insulating layer. The third gate insulating layer may include an insulating material.

Referring to FIGS. 1a, 2, 8, and 9, a third conductive pattern may be disposed on the third gate insulating layer. The third conductive pattern may include a voltage line 1510, a second gate electrode 1520, a fifth gate line 1530, and a first transmission pattern 1540.

The voltage line 1510 may extend in the first direction D1. In an example embodiment, the initialization voltage VINT may be provided through the voltage line 1510. The voltage line 1510 may provide the initialization voltage VINT to the protrusion part PTD. For example, the voltage line 1510 may overlap the protrusion part PTD in an overlap region OLA. In addition, the voltage line 1510 may contact the protrusion part PTD through a contact CNT. The contact CNT may be implemented with a first contact CNT1 illustrated in FIG. 12, the second and third contacts CNT2 and CNT3 illustrated in FIG. 18, and the like. A detailed description of the overlapping region OLA and the contact CNT will be described later.

The second gate electrode 1520 may overlap the third gate line 1310 and the second active pattern 1400. The second gate electrode 1520 may be electrically connected to the third gate line 1310. For example, the second gate electrode 1520 may contact the third gate line 1310 through a contact. The third gate signal GC may be provided to the second gate electrode 1520. The third gate line 1310, the second active pattern 1400, and the second gate electrode 1520 may constitute the fourth transistor T4. For example, the third gate line 1310 may correspond to the back-gate terminal of the fourth transistor T4 described with reference to FIG. 2, and the second gate electrode 1520 may correspond to the gate terminal of the fourth transistor T4 the described with reference to FIG. 2.

The fifth gate line 1530 may extend in the first direction D1. The fifth gate line 1530 may overlap the fourth gate line 1320 and the second active pattern 1400. The fifth gate line 1530 may be electrically connected to the fourth gate line 1320. For example, the fifth gate line 1530 may contact the fourth gate line 1320 through a contact. The second gate signal GI may be provided to the fifth gate line 1530. The fourth gate line 1320, the second active pattern 1400, and the fifth gate line 1530 may constitute the third transistor T3. For example, the fourth gate line 1320 may correspond to the back-gate terminal of the third transistor T3 described with reference to FIG. 2, and the fifth gate line 1530 may correspond to the gate terminal of the third transistor T3 described with reference to FIG. 2.

The first transmission pattern 1540 may contact the exposed first gate electrode 1220. The first transmission pattern 1540 may transmit the initialization voltage VINT to the first gate electrode 1220.

The second interlayer insulating layer may cover the third conductive pattern and may be disposed on the third gate insulating layer. The third interlayer insulating layer may include an insulating material. For example, the third interlayer insulating layer may include silicon oxide, silicon nitride, silicon oxynitride, aluminum oxide, or the like.

Figure 10:
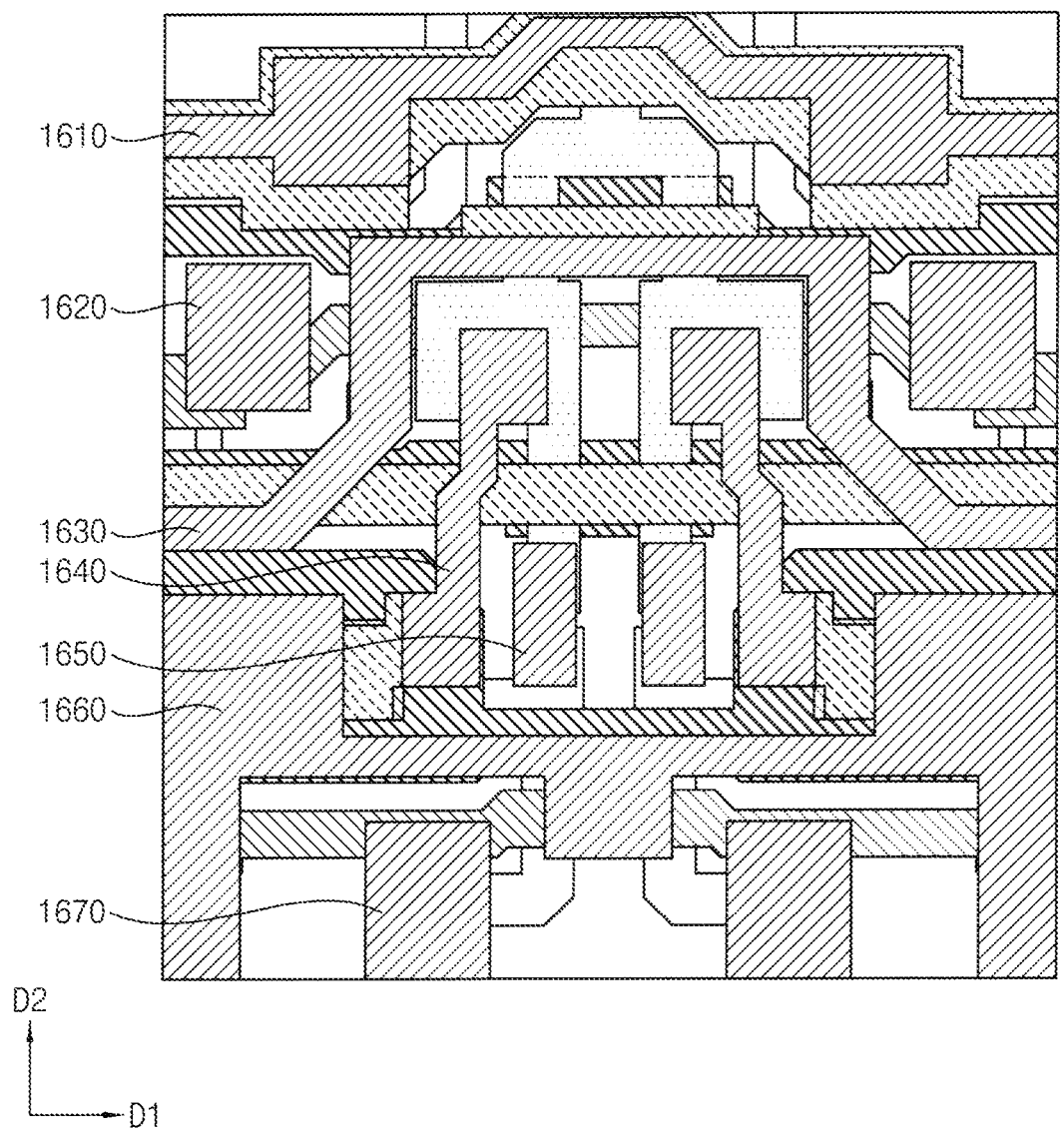

Referring to FIGS. 1a, 2, and 10, a fourth conductive pattern may be disposed on the second interlayer insulating layer. The fourth conductive pattern may include a data transmission horizontal line 1610, a second transmission pattern 1620, an anode initialization voltage line 1630, a third transmission pattern 1640, a fourth transmission pattern 1650, a fifth transmission pattern 1660, and a sixth transmission pattern 1670.

The data transmission horizontal line 1610 may extend in the first direction D1. The data voltage DATA may be provided to the data transmission horizontal line 1610. In an example embodiment, the data transmission horizontal line 1610 may overlap the voltage line 1510. For example, the voltage line 1510 may shield the data transmission horizontal line 1610.

The second transmission pattern 1620 may contact the first active pattern 1100. The data voltage DATA may be transmitted to the first active pattern 1100 through the second transfer pattern 1620.

The anode initialization voltage line 1630 may extend in the first direction D1. The anode initialization voltage AINT may be provided to the anode initialization voltage line 1630. The anode initialization voltage line 1630 may contact the first active pattern 1100 and may transmit the anode initialization voltage AINT to the first active pattern 1100.

The third transmission pattern 1640 may contact the second active pattern 1400 and the first transmission pattern 1540. The initialization voltage VINT may be transmitted to the first gate electrode 1220 through the voltage line 1510, the second active pattern 1400, the third transmission pattern 1640, and the first transmission pattern 1540.

The fourth transmission pattern 1650 may contact the second active pattern 1400 and the first active pattern 1100. The fourth transmission pattern 1650 may electrically connect the second active pattern 1400 and the first active pattern 1100.

The fifth transmission pattern 1660 may extend in the first direction D1. The high power voltage ELVDD may be provided to the fifth transmission pattern 1660. The fifth transmission pattern 1660 may contact the first active pattern 1100 and may transmit the high power voltage ELVDD to the first active pattern 1100.

The sixth transmission pattern 1670 may contact the first active pattern 1100. The sixth transmission pattern 1670 may transmit the driving current and/or the anode initialization voltage AINT from the first active pattern 1100 to the organic light emitting diode OLED.

The first via insulating layer may cover the fourth conductive pattern and may be disposed on the second interlayer insulating layer. The first via insulating layer may include an organic insulating material. For example, the first via insulating layer may include a photoresist, a polyacrylic resin, a polyimide resin, an acrylic resin, or the like.

Referring to FIGS. 1a, 2, and 11, a fifth conductive pattern may be disposed on the first via insulating layer. The fifth conductive pattern may include a data line 1710, a data transmission vertical line 1720, a high power voltage line 1730, and a seventh transmission pattern 1740.

The data line 1710 may extend in the second direction D2. The data voltage DATA may be transmitted to the first active pattern 1100 through the data line 1710 and the second transmission pattern 1620.

The data transmission vertical line 1720 may extend in the second direction D2. The data transmission vertical line 1720 may contact the data transmission horizontal line 1610. In an example embodiment, the data transmission vertical line 1720 may overlap the voltage line 1510, the anode initialization voltage line 1630, and the fifth transmission pattern 1660. The voltage line 1510, the anode initialization voltage line 1630, and the fifth transmission pattern 1660 may shield the data transmission vertical line 1720.

In an example embodiment, the data transmission horizontal line 1610 may correspond to the first data transmission horizontal line HFL1 described with reference to FIG. 1c, the data line 1710 may correspond to the fourth data line DL4 described with reference to FIG. 1c, the data transmission vertical line 1720 may correspond to the first data transmission vertical line VFL1 described with reference to FIG. 1c. For example, different data voltages may be provided to the data line 1710 and the data transmission vertical line 1720. In detail, a first data voltage may be transmitted to the first active pattern 1100 through the data line 1710, and a second data voltage different from the first data voltage may be transmitted to the data transmission horizontal line 1610 through the data transmission vertical line 1720.

The seventh transmission pattern 1740 may contact the sixth transmission pattern 1670. The seventh transmission pattern 1740 may transmit the driving current and/or the anode initialization voltage AINT from the sixth transmission pattern 1670 to the organic light emitting diode OLED.

The second via insulating layer may cover the fifth conductive pattern and may be disposed on the first via insulating layer. The second via insulating layer may include an organic insulating material.

Figure 9:
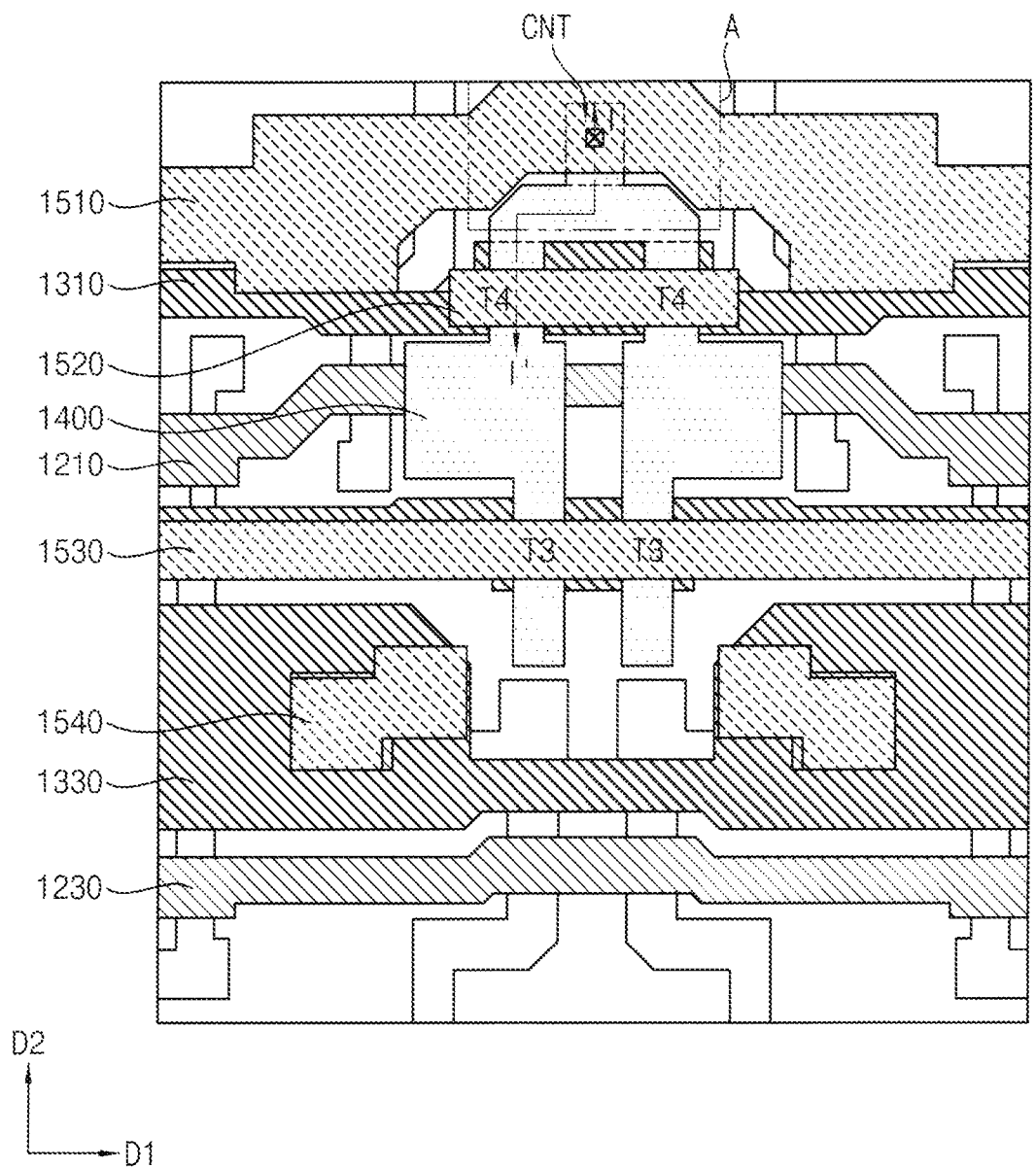
Figure 12:
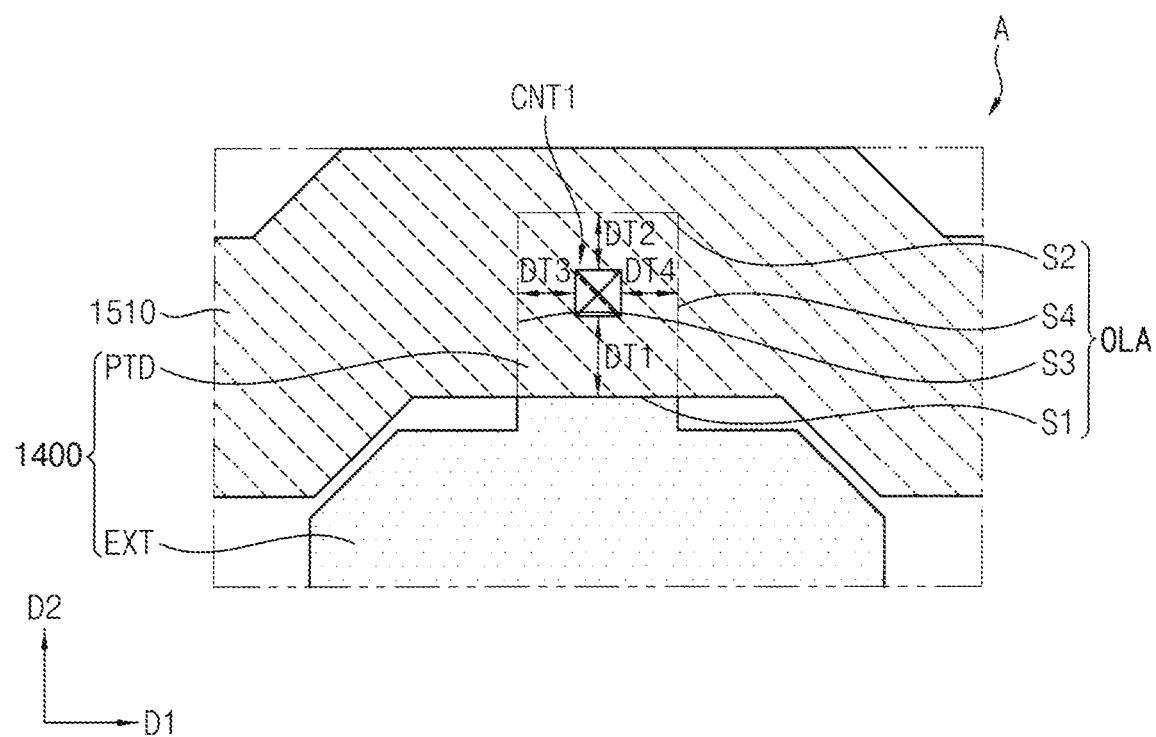
FIG. 12 is an enlarged view illustrating an example of region A of FIG. 9.
Figure 13:
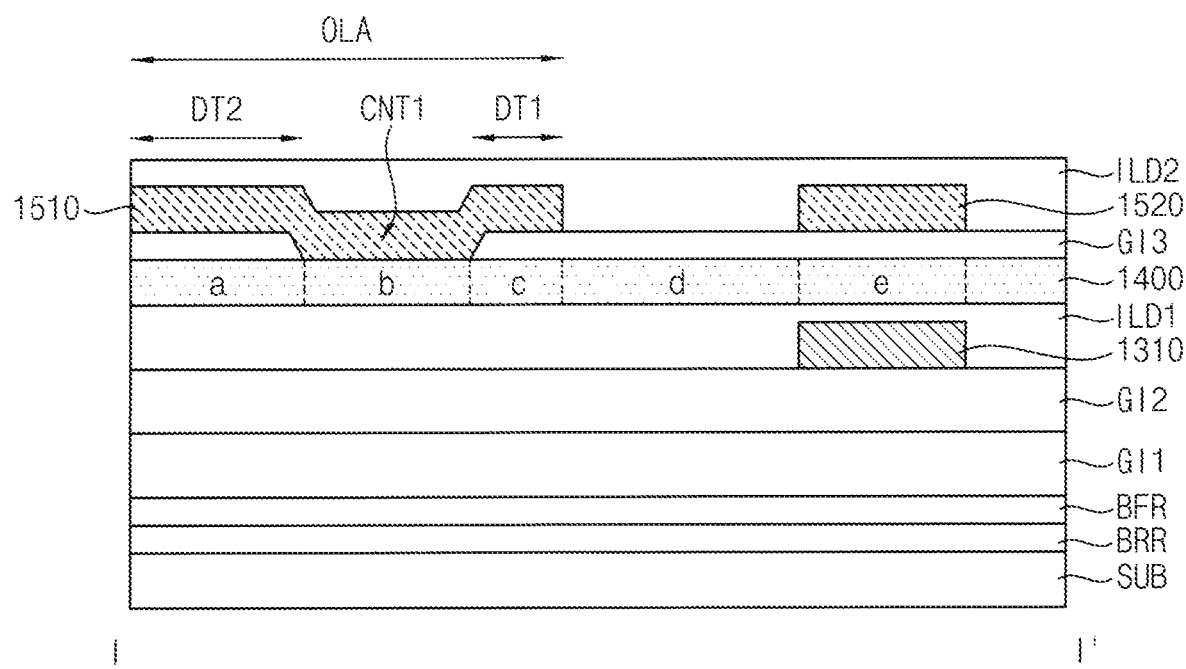
FIG. 13 is a cross-sectional view taken along line I-I' of FIG. 9.

FIG. 12 is an enlarged view illustrating an example of region A of FIG. 9. FIG. 13 is a cross-sectional view taken along line I-I' of FIG. 9. FIG. 14 to FIG. 17 are cross-sectional views illustrating a method of manufacturing the pixel structure of FIG. 13.

Referring to FIGS. 9 and 12, the voltage line 1510 may overlap the protrusion part PTD in the overlapping region OLA on a plane. In addition, the voltage line 1510 may be spaced apart from the extension part EXT. In an example embodiment, the overlapping region OLA may have a rectangular shape. The rectangular shape may include a first side S1, a second side S2, a third side S3, and a fourth side S4. For example, the first side S1 may be adjacent to the extension part EXT and may extend in the first direction D1. The second side S2 may be opposite to the first side S1 and may extend in the first direction D1. The third side S3 may connect one side of the first side S1 and one side of the second side S2. The third side S3 may extend in the second direction D2. The fourth side may connect the other side of the first side S1 and the other side of the second side S2. The fourth side S4 may extend in the second direction D2.

In an example embodiment, the voltage line 1510 may contact the protrusion part PTD through the first contact CNT1. The first contact CNT1 may entirely overlap the overlapping region OLA. In addition, a planar area of the first contact CNT1 may be smaller than a planar area of the overlap region OLA. For example, a width of the first contact CNT1 in the first direction D1 may be about 1 um to about 3 um, and a width of the second direction D2 may be about 1 um to about 3 um. In other words, the first side S1 may be spaced apart from the first contact CNT1 by a first distance DT1, the second side S2 may be spaced apart from the first contact CNT1 by a second distance DT2, the third side S3 may be spaced apart from the first contact CNT1 by a third distance DT3, and the fourth side S4 may be spaced apart from the first contact CNT1 by a fourth distance DT4. For example, the first distance DT1 may be about 1 um to about 10 um. In addition, each of the third distance DT3 and the fourth distance DT4 may be about 1 um to about 3 um. For example, the third distance DT3 and the fourth distance DT4 may be the same to each other.

In an example embodiment, all of the first pixel structures PX1 included in the display device 10 may have the same structure, and all of the second pixel structures PX2 may have the same structure. In addition, the first contact CNT1 may entirely overlap the overlapping region OLA. Accordingly, the protrusion part PTD exposed by the first contact CNT1 may entirely contact the voltage line 1510. Therefore, distribution of contact resistance between the voltage line 1510 and the protrusion part PTD occurring in the pixel structures may be reduced.

Referring to FIGS. 9 and 13, the second active pattern 1400 may include a first part (a), a second part (b), a third part (c), a fourth part (d), and a fifth part (e). The first part (a) may be a part overlapping the voltage line 1510 and not contacting the voltage line 1510. The second part (b) may be a part contacting the voltage line 1510. The third part (c) may be a part that is adjacent to one side of the extension part EXT and does not contact the voltage line 1510. The first to third parts (a), (b), and (c) may correspond to the protrusion part PTD. The fourth part (d) may be a part not overlapping the voltage line 1510 and the second gate electrode 1520. The fourth part (d) may correspond to the extension part EXT. The fifth portion (e) may be a portion overlapping the second gate electrode 1520. Ions may not be doped in the first, second, third, and fifth parts (a), (b), (c), and (e) overlapping the voltage line 1510 or the second gate electrode 1520. Ions may be doped in the fourth part (d) not overlapping the voltage line 1510 and the second gate electrode 1520.

In an example embodiment, the first to fifth parts (a), (b), (c), (d), and (e) may have different sheet resistances. For example, while the first contact CNT1 is formed, oxygen vacancy may be generated in the second active pattern 1400, and the oxygen vacancy may diffuse into the third part (c). In addition, hydrogen ions may diffuse from the second interlayer insulating layer ILD2 including silicon oxide and/or silicon nitride to the third part (c). Accordingly, the sheet resistance of the third part (c) may be smaller than the sheet resistance of the fifth part (d).

Figure 14:
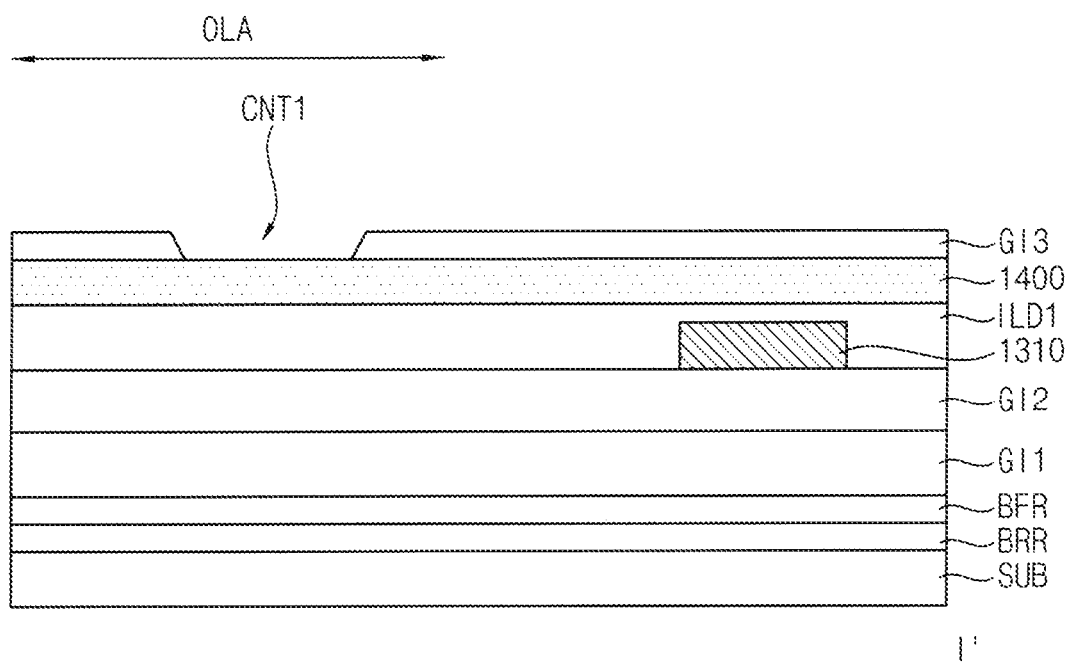
FIGS. 14, 15, 16, and 17 are cross-sectional views illustrating a method of manufacturing the pixel structure of FIG. 13.

Referring to FIGS. 13 and 14, a buffer layer BFR, a first gate insulating layer GIL a second gate insulating layer GI2, the third gate line 1310, and a first interlayer insulating layer ILD1, the second active pattern 1400, and the third gate insulating layer GI3 may be sequentially formed on the substrate SUB. The first contact CNT1 penetrating the third gate insulating layer GI3 may be formed on the third gate insulating layer GI3. A part of an upper surface of the second active pattern 1400 may be exposed by the first contact CNT1.

Figure 15:
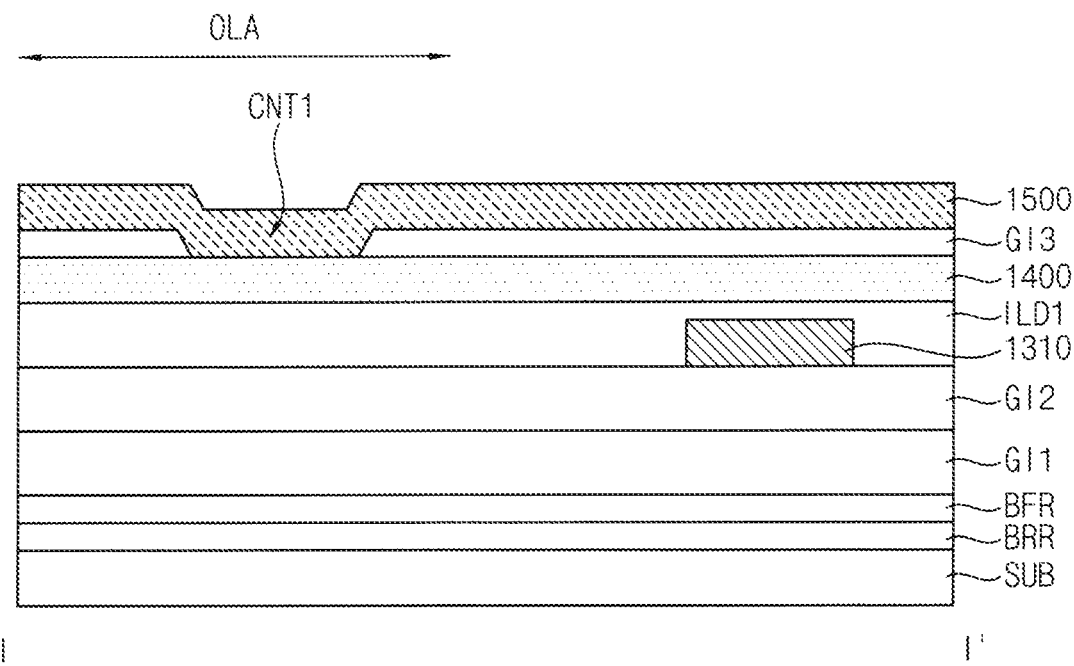

Referring to FIGS. 13 and 15, a preliminary third conductive pattern 1500 may be formed on the third gate insulating layer GI3. The preliminary third conductive pattern 1500 may entirely cover the first contact CNT1 and may have substantially the same thickness. The preliminary third conductive pattern 1500 may include a metal, an alloy, a conductive metal oxide, a transparent conductive material, and the like. For example, the preliminary third conductive pattern 1500 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like.

Figure 16:
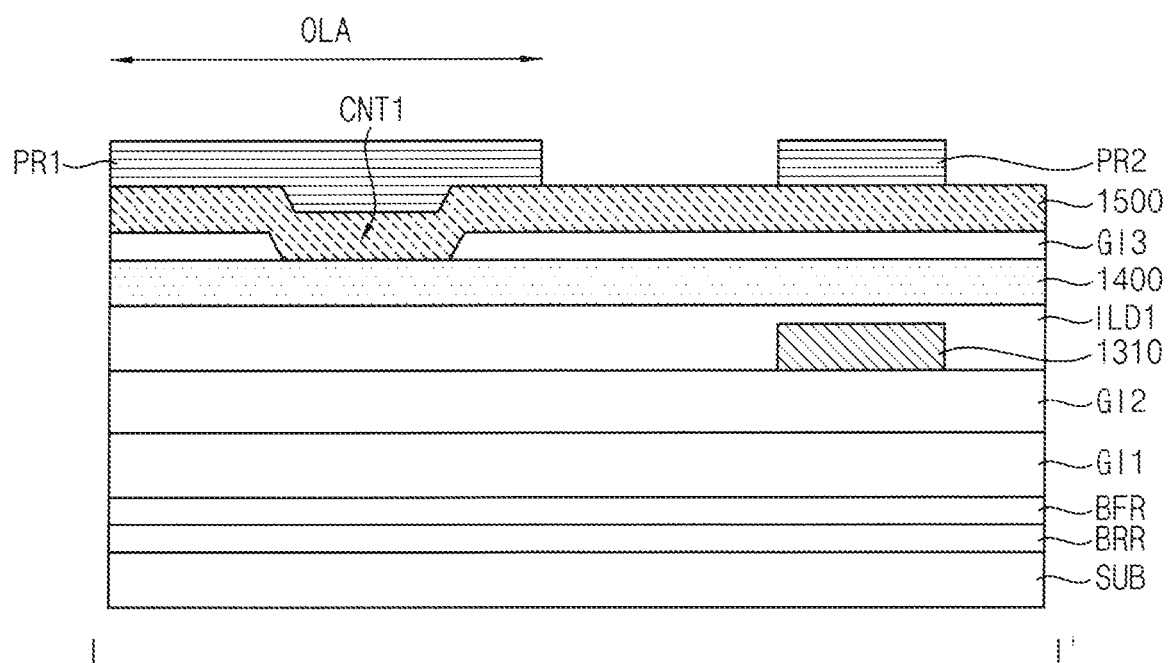

Referring to FIGS. 13 and 16, a first photoresist PR1 and a second photoresist PR2 may be formed on the preliminary third conductive pattern 1500. The first photoresist PR1 may overlap the overlapping region OLA, and may entirely overlap the first contact CNT1. The second photoresist PR2 may overlap the third gate line 1310.

Figure 17:
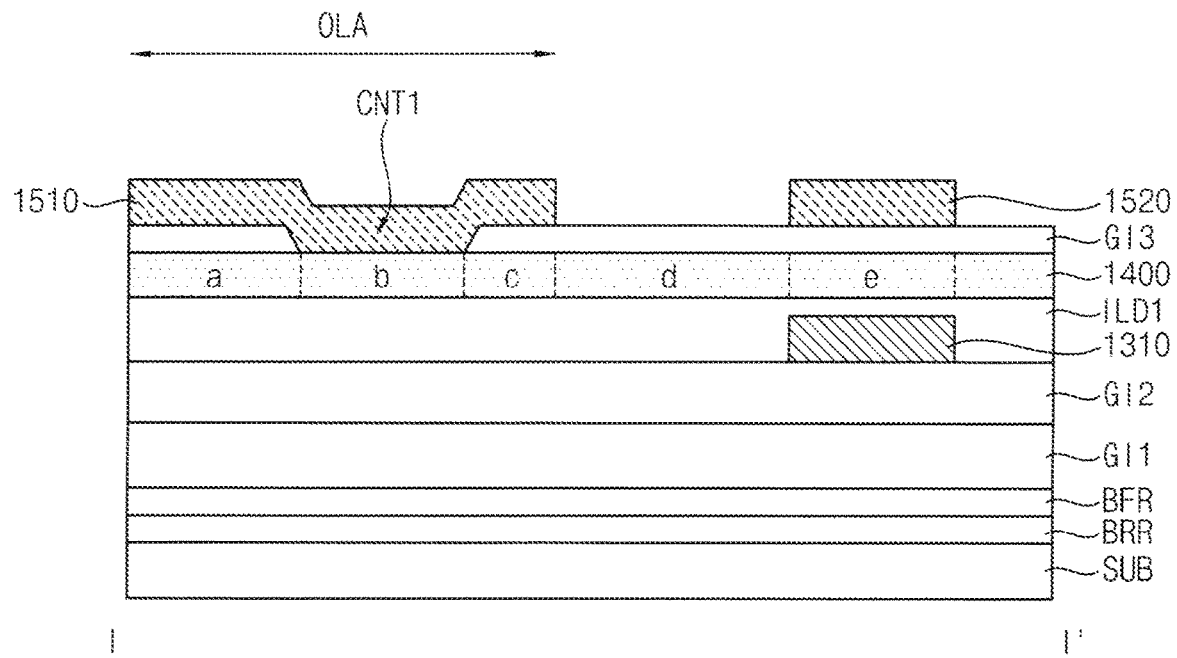

Referring to FIGS. 13 and 17, the preliminary third conductive pattern 1500 may be patterned through an etching process. For example, the preliminary third conductive pattern 1500 that does not overlap with the first and second photoresists PR1 and PR2 may be removed through a dry etching process. Accordingly, the voltage line 1510 and the second gate electrode 1520 may be formed.

Figure 18:
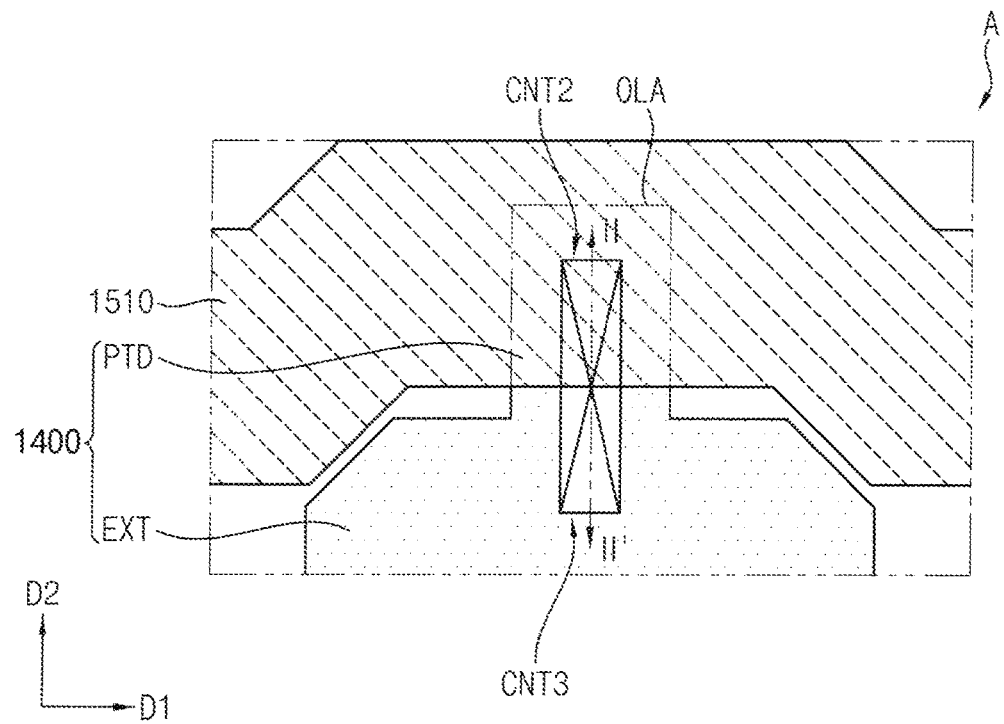
FIG. 18 is an enlarged view illustrating another example of region A of FIG. 9.
Figure 19:
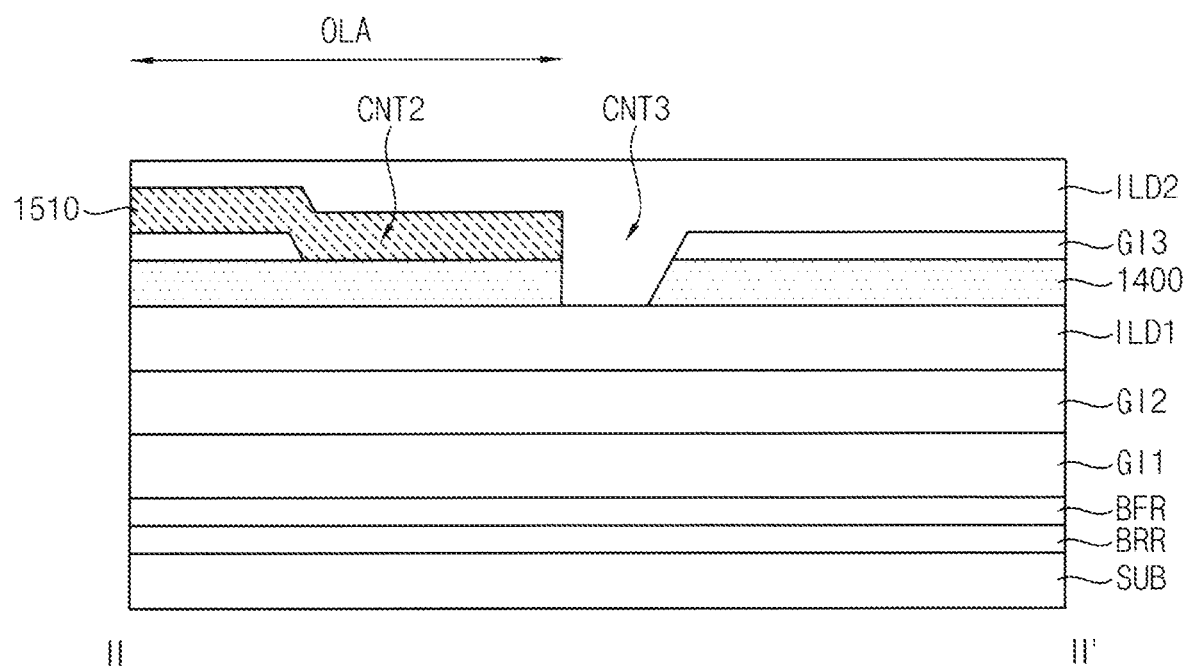
FIG. 19 is a cross-sectional view taken along line II-II' of FIG. 18.

FIG. 18 is an enlarged view illustrating another example of region A of FIG. 9. FIG. 19 is a cross-sectional view taken along line II-II' of FIG. 18. FIG. 20 to FIG. 24 are cross-sectional views illustrating a method of manufacturing the pixel structure of FIG. 19.

Referring to FIGS. 9 and 18, the voltage line 1510 may overlap the protrusion part PTD in the overlapping region OLA on a plane. In addition, the voltage line 1510 may be spaced apart from the extension part EXT.

Referring to FIGS. 9, 18, and 19, the voltage line 1510 may contact the protrusion part PTD through a second contact CNT2, and the second interlayer insulating layer ILD2 may contact the first interlayer insulating layer ILD1 through a third contact CNT3. In an example embodiment, the second contact CNT2 may overlap the overlapping region OLA. The third contact CNT3 may be connected to the second contact CNT2 and may penetrate the extension part EXT. As the third contact CNT3 penetrates the extension part EXT, electrical characteristics of the second active pattern 1400 may be improved.

Figure 20:
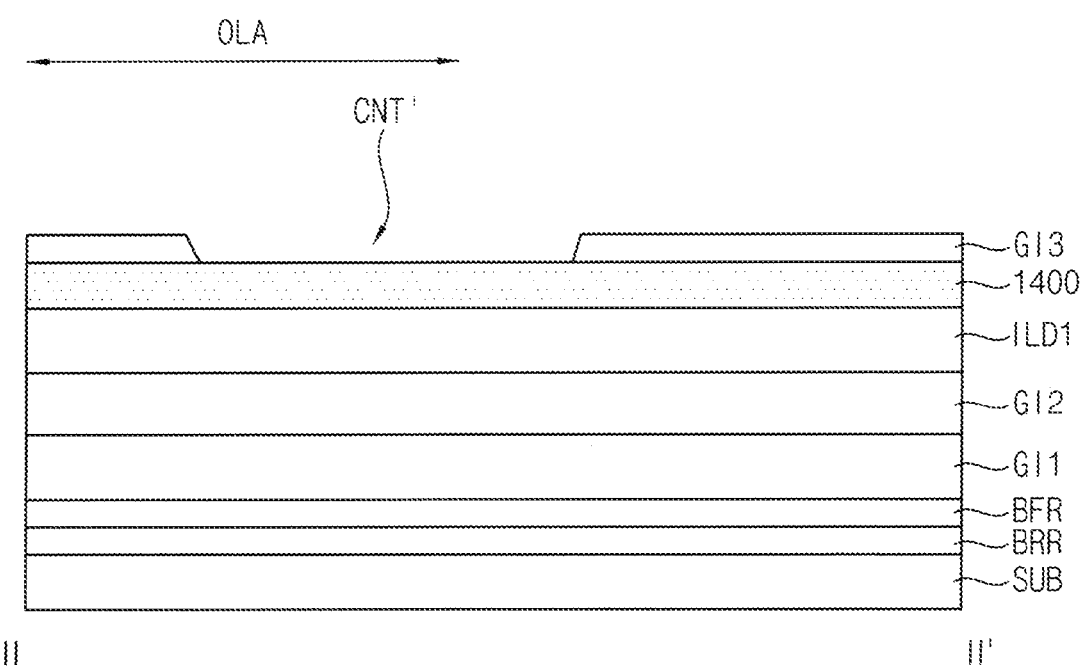
FIGS. 20, 21, 22 and 23 24 are cross-sectional views illustrating a method of manufacturing the pixel structure of FIG. 19.

Referring to FIGS. 19 and 20, the barrier layer BRR, the buffer layer BFR, the first gate insulating layer GI1, the second gate insulating layer GI2, the second gate insulating layer GI2, the first interlayer insulating layer ILD1, the second active pattern 1400, and the third gate insulating layer GI3 may be sequentially formed on the substrate SUB. A preliminary contact CNT' penetrating the third gate insulating layer GI3 may be formed in the third gate insulating layer GI3. A part of an upper surface of the second active pattern 1400 may be exposed by the preliminary contact CNT'. A part of the preliminary contact CNT' may form the second contact CNT2, and another part of the preliminary contact CNT' may form the third contact CNT3.

Figure 21:
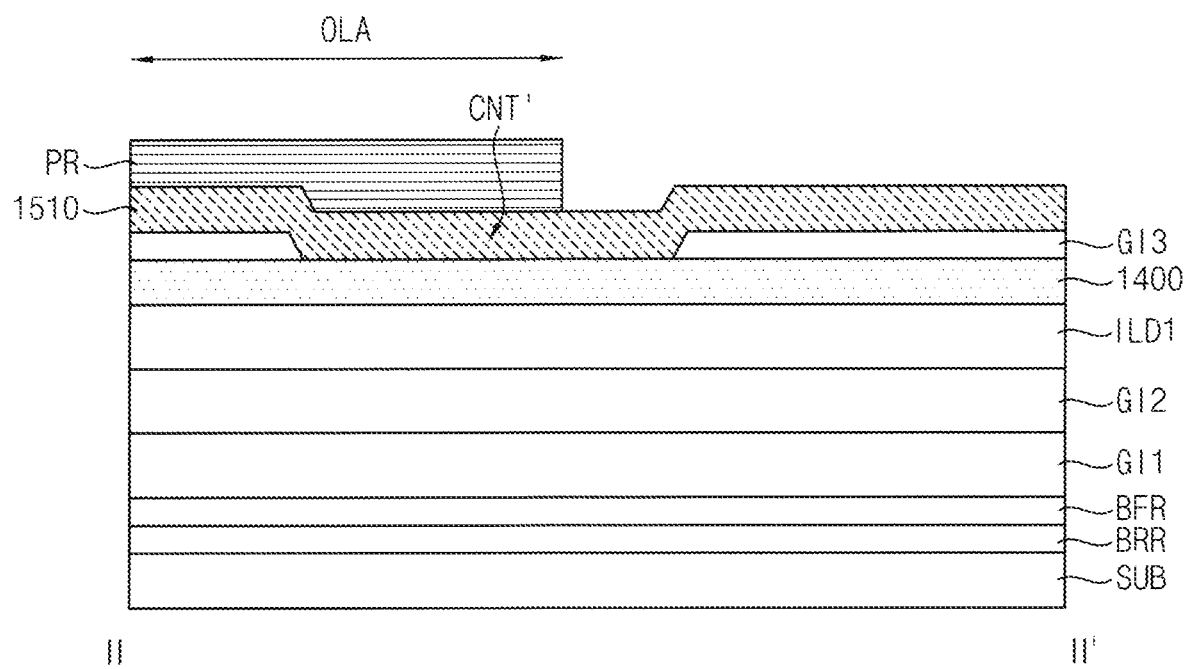

Referring to FIGS. 19 and 21, a preliminary third conductive pattern 1500 may be formed on the third gate insulating layer GI3, and a photoresist PR may be formed on the preliminary third conductive pattern 1500. The preliminary third conductive pattern 1500 may entirely cover the first contact CNT1 and may have substantially the same thickness. The photoresist PR may overlap the overlapping region OLA, and may entirely overlap the part of the preliminary contact CNT'. For example, the preliminary third conductive pattern may include silver ("Ag"), an alloy containing silver, molybdenum ("Mo"), an alloy containing molybdenum, aluminum ("Al"), an alloy containing aluminum, aluminum nitride ("AN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and the like.

Figure 22:
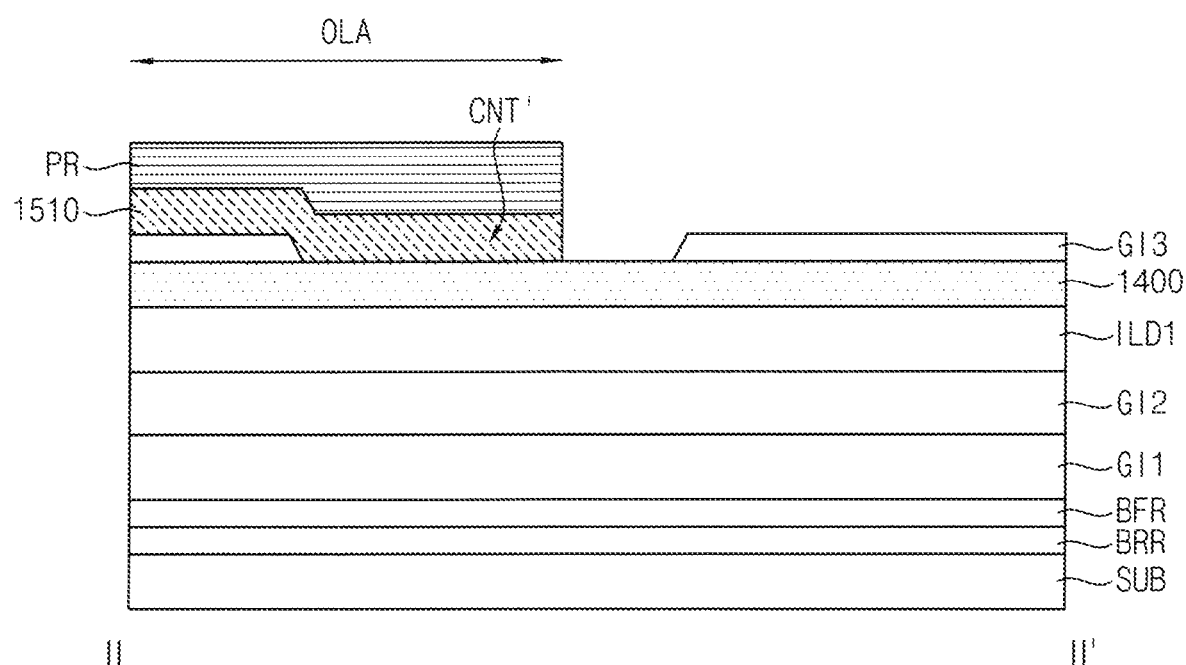

Referring to FIGS. 19 and 22, the preliminary third conductive pattern 1500 may be patterned through an etching process. For example, the preliminary third conductive pattern 1500 that does not overlap with the photoresist PR may be removed through a dry etching process. Accordingly, the voltage line 1510 contacting the protrusion part PTD through the second contact CNT2 may be formed.

Figure 23:
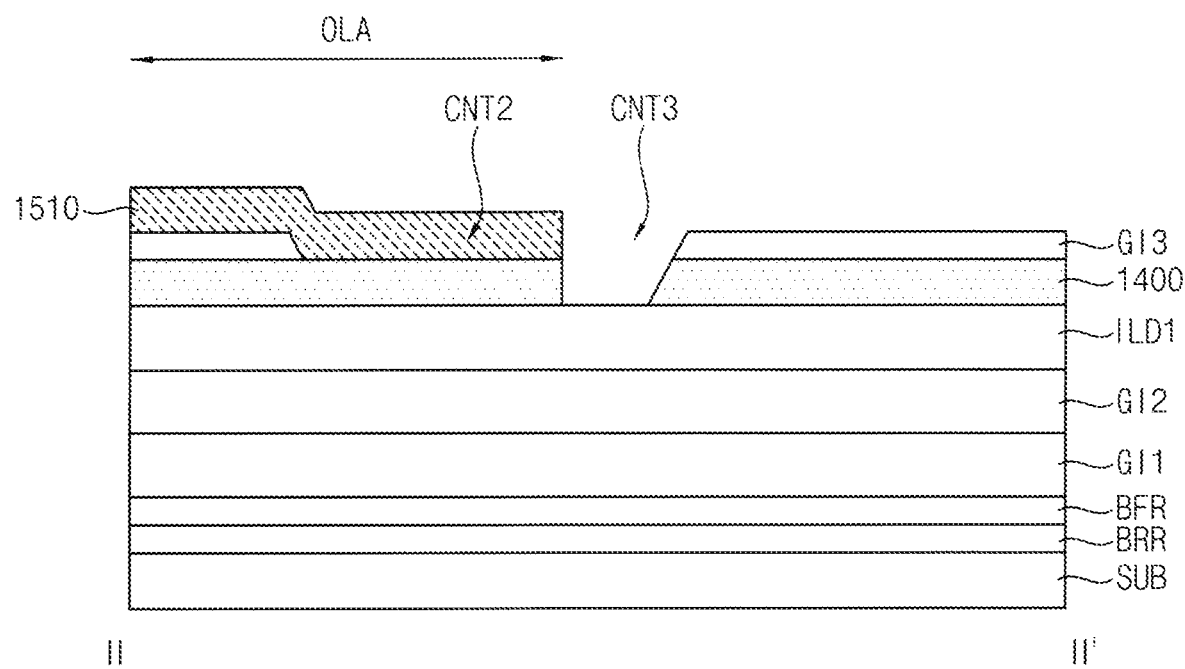

Referring to FIGS. 19 and 23, the second active pattern 1400 may be patterned through the etching process. For example, the second active pattern 1400 that does not overlap the third gate insulating layer GI3 may be removed through the dry etching process. Accordingly, the third contact CNT3 penetrating the second active pattern 1400 may be formed.

Figure 24:
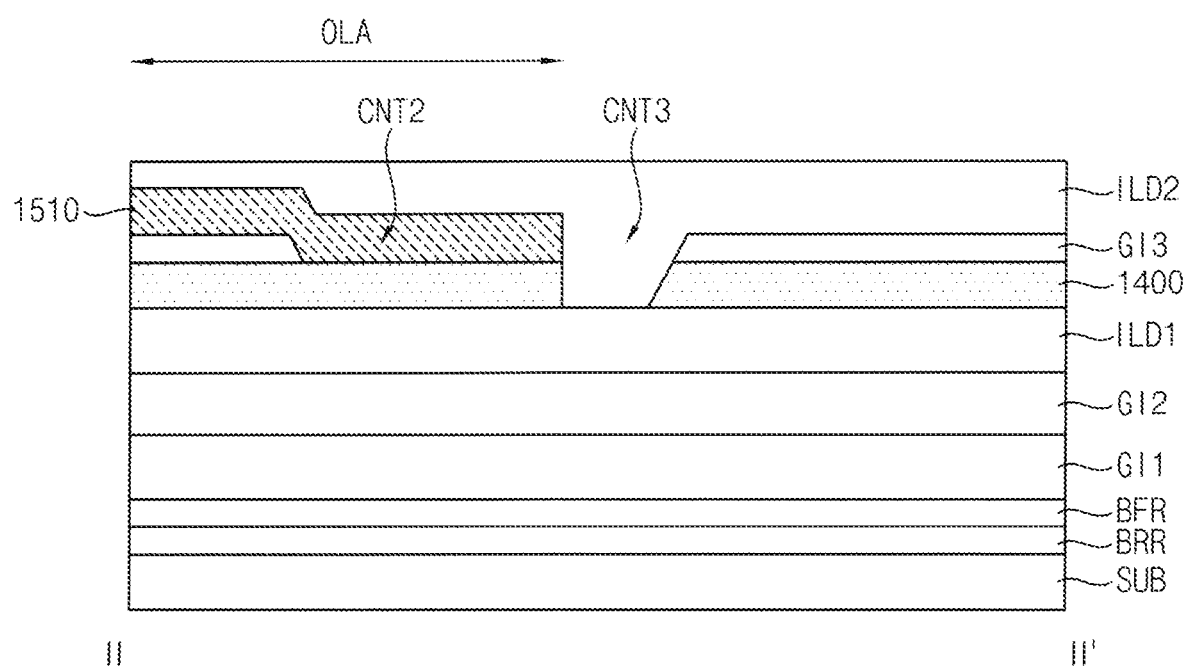

Referring to FIGS. 19 and 24, the second interlayer insulating layer ILD2 may be formed on the third gate insulating layer GI3. The second interlayer insulating layer ILD2 may contact the first interlayer insulating layer ILD1 through the third contact CNT3.

Figure 25:
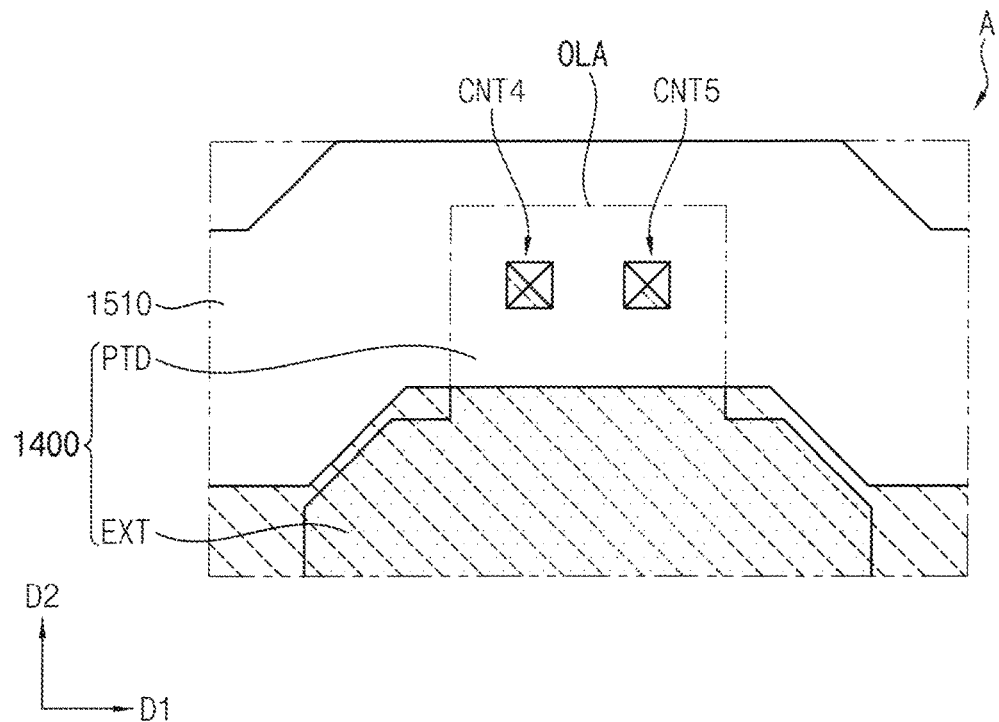
FIG. 25 is an enlarged view illustrating still another example of region A of FIG. 9.

FIG. 25 is an enlarged view illustrating still another example of region A of FIG. 9.

Referring to FIGS. 9 and 25, the voltage line 1510 may overlap the protrusion part PTD in the overlapping region OLA on a plane. In addition, the voltage line 1510 may be spaced apart from the extension part EXT.

The voltage line 1510 may contact the protrusion part PTD through a fourth contact CNT4. The fourth contact CNT4 may entirely overlap the overlapping region OLA. In addition, a planar area of the first contact CNT4 may be smaller than a planar area of the overlap region OLA.

In addition, the voltage line 1510 may contact the protrusion part PTD through a fifth contact CNT5. The fifth contact CNT5 may be spaced apart from the fourth contact CNT4. In addition, the fifth contact CNT5 may entirely overlap with the overlapping region OLA, and a planar area of the fifth contact CNT5 may be smaller than the planar area of the overlapping region OLA.

As the voltage line 1510 contacts the protrusion part PTD through the fourth and fifth contacts CNT4 and CNT5, the contact resistance between the voltage line 1510 and the protrusion part PTD may be reduced. Accordingly, the distribution of the contact resistance between the voltage line 1510 and the protrusion part PTD generated in the pixel structures may be reduced.

Figure 26:
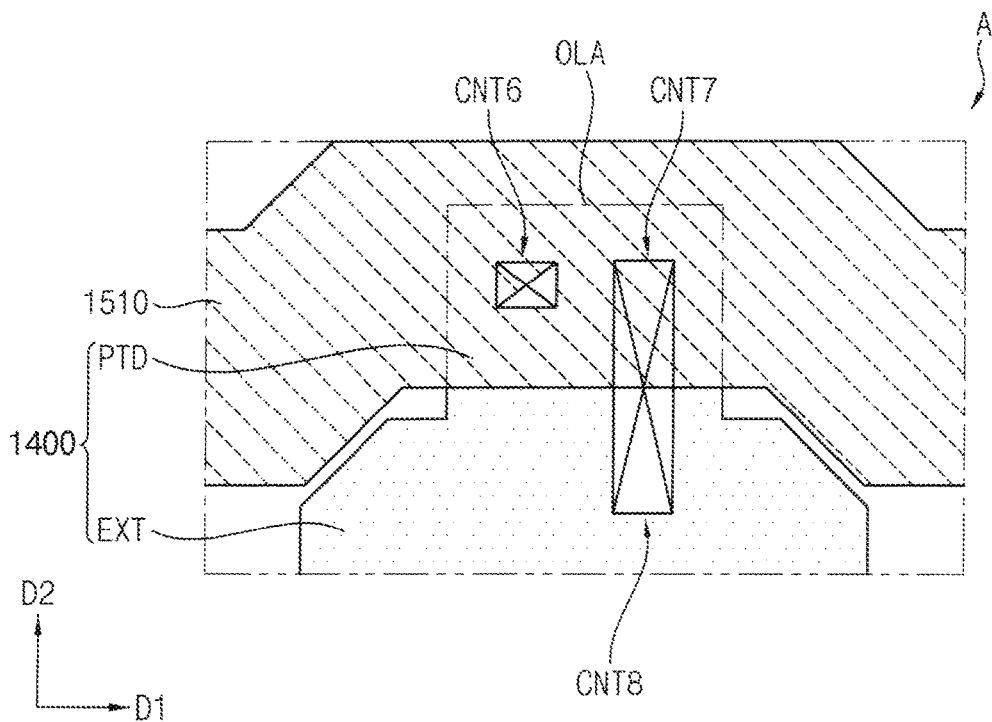
FIG. 26 is an enlarged view illustrating still another example of region A of FIG. 9.

FIG. 26 is an enlarged view illustrating still another example of region A of FIG. 9.

Referring to FIGS. 9 and 26, the voltage line 1510 may overlap the protrusion part PTD in the overlapping region OLA on a plane. In addition, the voltage line 1510 may be spaced apart from the extension part EXT.

The voltage line 1510 may contact the protrusion part PTD through a sixth contact CNT6. The sixth contact CNT6 may entirely overlap the overlapping region OLA. In addition, a planar area of the sixth contact CNT6 may be smaller than a planar area of the overlapping region OLA.

In addition, the voltage line 1510 may contact the protrusion part PTD through a seventh contact CNT7, and the second interlayer insulating layer ILD2 may contact the first interlayer insulating layer ILD1 through an eighth contact CNT8. In an example embodiment, the seventh contact CNT7 may overlap the overlapping region OLA. The eighth contact CNT8 may be connected to the second contact CNT7 and may penetrate the extension part EXT.

As the voltage line 1510 contacts the protrusion part PTD through the sixth and seventh contacts CNT6 and CNT7, the contact resistance between the voltage line 1510 and the protrusion part PTD may be reduced. Accordingly, the distribution of the contact resistance between the voltage line 1510 and the protrusion part PTD generated in the pixel structures may be reduced. In addition, as the eighth contact CNT8 penetrates the extension part EXT, the electrical characteristics of the second active pattern 1400 may be improved.

Figure 27:
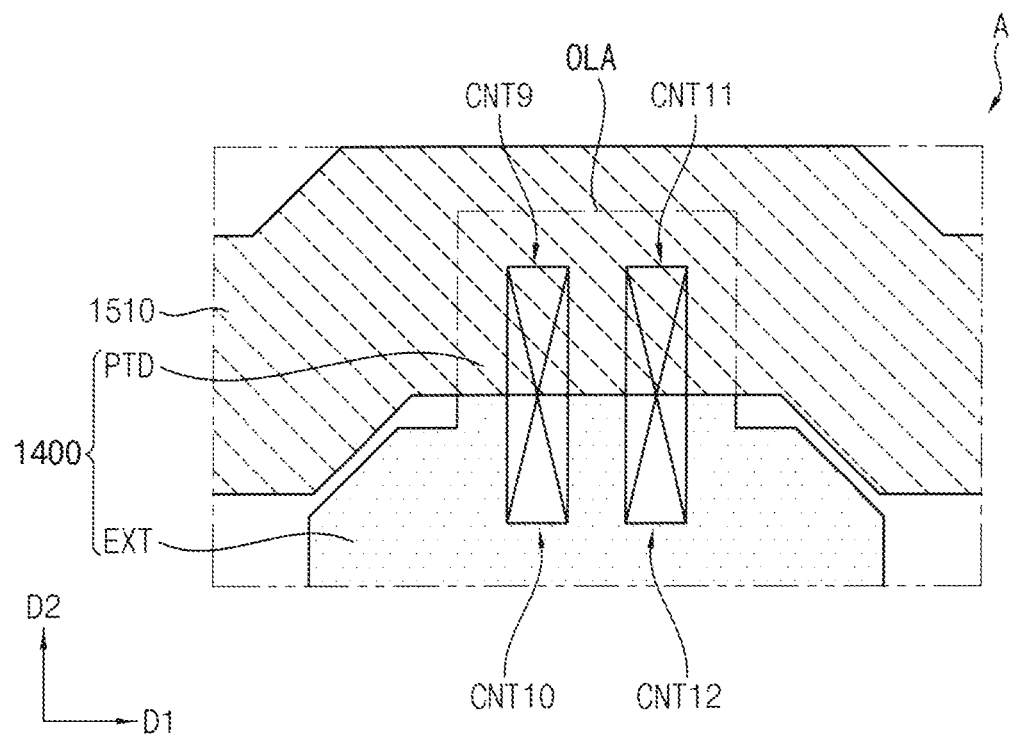
FIG. 27 is an enlarged view illustrating still another example of region A of FIG. 9.

FIG. 27 is an enlarged view illustrating still another example of region A of FIG. 9.

Referring to FIGS. 9 and 27, the voltage line 1510 may contact the protrusion part PTD through a ninth contact CNT9, and the second interlayer insulating layer ILD2 may contact the first interlayer insulating layer ILD1 through a tenth contact CNT10. In an example embodiment, the ninth contact CNT9 may overlap the overlapping region OLA. The tenth contact CNT10 may be connected to the ninth contact CNT9 and may penetrate the extension part EXT.

In addition, the voltage line 1510 may contact the protrusion part PTD through an eleventh contact CNT11, and the second interlayer insulating layer ILD2 may contact the first interlayer insulating layer ILD1 through a twelfth contact CNT12. In an example embodiment, the eleventh contact CNT11 may overlap the overlapping region OLA. The twelfth contact CNT12 may be connected to the eleventh contact CNT11 and may penetrate the extension part EXT.

As the voltage line 1510 contacts the protrusion part PTD through the ninth and eleventh contacts CNT9 and CNT11, the contact resistance between the voltage line 1510 and the protrusion part PTD may be reduced. Accordingly, the distribution of the contact resistance between the voltage line 1510 and the protrusion part PTD generated in the pixel structures may be reduced. In addition, as the tenth and twelfth contacts CNT10 and CNT 12 penetrate the extension part EXT, the electrical characteristics of the second active pattern 1400 may be improved.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a first active pattern disposed on and above a substrate;
    a first gate electrode disposed on and above the first active pattern;
    a second active pattern disposed on and above the first gate electrode, being electrically connected to the first gate electrode, and constituting a first pixel structure and a second pixel structure adjacent to the first pixel structure; and
    a voltage line disposed on and above the first gate electrode and providing a voltage to the first gate electrode through the second active pattern.

2. The display device of claim 1, wherein a second active pattern includes a first portion and a second portion,
    the first portion constitutes the first pixel structure, and
    the second portion is connected to the first portion and constitutes the second pixel structure.

3. The display device of claim 2, wherein a physical layout of the first portion and the second portion are symmetrical to each other as seen in plan view.

4. The display device of claim 1, further comprising:
    a first gate line disposed on the first active pattern and providing a first gate signal to the second active pattern;
    an anode initialization voltage line disposed on the first gate line and providing an anode initialization voltage to the first active pattern; and
    a data transmission vertical line transmitting a data voltage and overlapping the anode initialization voltage line,
    wherein the anode initialization voltage line shields the first gate line from the data transmission vertical line.

5. The display device of claim 4, further comprising:
    a second gate line disposed under the first gate line and providing a second gate signal to the first active pattern,
    wherein the anode initialization voltage line further shields the second gate line from the data transmission vertical line.

6. The display device of claim 5, further comprising:
    a data line transmitting the data voltage, disposed in a same layer as the data transmission vertical line, and overlapping the anode initialization voltage line,
    wherein the anode initialization voltage line further shields the first and second gate lines from the data line.

7. The display device of claim 4, wherein the anode initialization voltage line is disposed in a different layer than the voltage line.

8. The display device of claim 1, wherein the first active pattern includes a silicon semiconductor, and the second active pattern includes an oxide semiconductor.

9. The display device of claim 1, wherein the first and second pixel structures provide current to different light emitting diodes.

10. A display device comprising:
a first active pattern disposed on a substrate;
a first gate electrode disposed on the first active pattern:
a second active pattern disposed on the first gate electrode, being electrically connected to the first gate electrode, and constituting a first pixel structure and a second pixel structure adjacent to the first pixel structure;
a voltage line disposed on the first gate electrode and providing a voltage to the first gate electrode through the second active pattern;
a first gate line disposed on the first active pattern and providing a first gate signal to the second active pattern; and
a data transmission horizontal line disposed on the voltage line, transmitting a data voltage, and overlapping the voltage line,
wherein the voltage line shields the first gate line from the data transmission horizontal line.

11. The display device of claim 10, further comprising:
a data transmission vertical line disposed on the voltage line, transmitting the data voltage, and overlapping the voltage line,
wherein the voltage line further shields the first gate line from the data transmission vertical line.

12. The display device of claim 11, further comprising:
a data line disposed in a same layer as the data transmission vertical line, transmitting the data voltage, and overlapping the voltage line,
wherein the voltage line further shields the first gate line from the data line.

13. A display device comprising:
a first active pattern disposed on a substrate;
a first gate electrode disposed on the first active pattern;
a second active pattern including an extension part extending in a first direction and a protrusion part protruding from the extension part in a second direction crossing the first direction disposed on the first gate electrode, being electrically connected to the first gate electrode, and constituting a first pixel structure and a second pixel structure adjacent to the first pixel structure; and
a voltage line disposed on the first gate electrode and providing a voltage to the first gate electrode through the second active pattern.

14. The display device of claim 13, wherein a second active pattern includes a first portion and a second portion,
the first portion constitutes the first pixel structure, and
the second portion is connected to the first portion and constitutes the second pixel structure.

15. The display device of claim 14, wherein the first portion and the second portion are symmetrical to each other.

16. The display device of claim 12, further comprising:
a first gate line disposed on the first active pattern and providing a first gate signal to the second active pattern; and
a data transmission horizontal line disposed on the voltage line, transmitting a data voltage, and overlapping the voltage line,
wherein the voltage line shields the first gate line from the data transmission horizontal line.

17. The display device of claim 16, further comprising:
a data transmission vertical line disposed on the voltage line, transmitting the data voltage, and overlapping the voltage line,
wherein the voltage line further shields the first gate line from the data transmission vertical line.

18. The display device of claim 17, further comprising:
a data line disposed in a same layer as the data transmission vertical line, transmitting the data voltage, and overlapping the voltage line,
wherein the voltage line further shields the first gate line from the data line.

19. The display device of claim 13, further comprising:
a first gate line disposed on the first active pattern and providing a first gate signal to the second active pattern;
an anode initialization voltage line disposed on the first gate line and providing an anode initialization voltage to the first active pattern; and
a data transmission vertical line transmitting a data voltage and overlapping the anode initialization voltage line,
wherein the anode initialization voltage line is disposed in a different layer than the voltage line, and
the anode initialization voltage line shields the first are line from the data transmission vertical line.

20. The display device of claim 13, wherein the first active pattern includes a silicon semiconductor, and
the second active pattern includes an oxide semiconductor.

* * * * *